United States Patent
Choi et al.

(10) Patent No.: US 8,994,048 B2
(45) Date of Patent: Mar. 31, 2015

(54) SEMICONDUCTOR DEVICE AND METHOD OF FORMING RECESSES IN SUBSTRATE FOR SAME SIZE OR DIFFERENT SIZED DIE WITH VERTICAL INTEGRATION

(75) Inventors: JoonYoung Choi, Kyoung-ki-do (KR); YongHee Kang, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 277 days.

(21) Appl. No.: 12/964,117

(22) Filed: Dec. 9, 2010

(65) Prior Publication Data

US 2012/0146177 A1    Jun. 14, 2012

(51) Int. Cl.
*H01L 33/00* (2010.01)
*H01L 25/16* (2006.01)
*H01L 25/065* (2006.01)
*H01L 25/10* (2006.01)
*H01L 23/13* (2006.01)
(Continued)

(52) U.S. Cl.
CPC ............ *H01L 25/16* (2013.01); *H01L 25/0655* (2013.01); *H01L 25/105* (2013.01); *H01L 23/13* (2013.01); *H01L 24/97* (2013.01); *H01L 2224/0558* (2013.01); *H01L 23/3128* (2013.01); *H01L 24/16* (2013.01); *H01L 21/6835* (2013.01); *H01L 24/81* (2013.01); *H01L 2221/68345* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/81132* (2013.01); *H01L 2224/81191* (2013.01); *H01L 2225/1058* (2013.01); *H01L 2224/16237* (2013.01); *H01L 2224/32245* (2013.01); *H01L 2224/73253* (2013.01); *H01L 2924/00013* (2013.01); *H01L 23/147* (2013.01); *H01L 23/49827* (2013.01); *H01L 21/486* (2013.01); *H01L 2924/15156* (2013.01); *H01L 2924/15311* (2013.01); *H01L 2924/15331* (2013.01); *H01L 2924/157* (2013.01); *H01L 2924/18161* (2013.01); *H01L 2924/19107* (2013.01); *H01L 2225/1029* (2013.01); *H01L 2225/1052* (2013.01); *H01L 2924/13091* (2013.01); *H01L 2225/1047* (2013.01); *H01L 2924/01322* (2013.01);
(Continued)

(58) Field of Classification Search
USPC .................. 257/528, 534, E21.499–E21.513, 257/E23.01, E23.02, E23.021, E23.023, 257/E23.051, 98; 438/107–109, 122, 438/455–456, 25–28
See application file for complete search history.

(56) References Cited

U.S. PATENT DOCUMENTS

| | | | | |
|---|---|---|---|---|
| 5,214,308 A | * | 5/1993 | Nishiguchi et al. | 257/692 |
| 6,531,328 B1 | * | 3/2003 | Chen | 438/26 |

(Continued)

*Primary Examiner* — Sonya D McCall Shepard
(74) *Attorney, Agent, or Firm* — Robert D. Atkins; Patent Law Group: Atkins and Associates, P.C.

(57) ABSTRACT

A semiconductor device has a substrate with a first and second recess formed in a surface of the substrate using a wet etch process. The second recess can have a size different from a size of the first recess. A plurality of conductive vias are formed in a surface of the first and second recesses using a dry etch process. A first conductive layer is formed over the surface of the substrate, over curved side walls of the first and second recesses, and electrically connected to the plurality of conductive vias. A first and second semiconductor die are mounted into the first and second recesses respectively. The second semiconductor die can have a size different from a size of the first semiconductor die. The first and second semiconductor die are electrically connected to the first conductive layer. An interconnect structure is electrically connected to the plurality of conductive vias.

29 Claims, 19 Drawing Sheets

(51) Int. Cl.
  *H01L 23/00* (2006.01)
  *H01L 23/31* (2006.01)
  *H01L 21/683* (2006.01)
  *H01L 23/14* (2006.01)
  *H01L 23/498* (2006.01)
  *H01L 21/48* (2006.01)

(52) U.S. Cl.
  CPC ............... *H01L 2224/48091* (2013.01); *H01L 2224/73265* (2013.01); *H01L 2224/97* (2013.01)
  USPC .............................. 257/98; 257/528; 438/28

(56) References Cited

U.S. PATENT DOCUMENTS

| | | |
|---|---|---|
| 6,664,130 B2 | 12/2003 | Akram |
| 6,998,344 B2* | 2/2006 | Akram et al. ............... 438/667 |
| 2002/0008325 A1* | 1/2002 | Tominaga .................... 257/778 |
| 2004/0217456 A1* | 11/2004 | Takano ........................ 257/678 |
| 2006/0180828 A1* | 8/2006 | Kim et al. .................... 257/100 |
| 2007/0109756 A1 | 5/2007 | Park et al. |
| 2008/0128882 A1 | 6/2008 | Baek et al. |

* cited by examiner

SEMICONDUCTOR DEVICE AND METHOD OF FORMING RECESSES IN SUBSTRATE FOR SAME SIZE OR DIFFERENT SIZED DIE WITH VERTICAL INTEGRATION

FIELD OF THE INVENTION

The present invention relates in general to semiconductor devices and, more particularly, to a semiconductor device and method of forming recesses in a substrate for same sized die or different sized die with z-direction electrical interconnection.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Most if not all wafer level chip scale packages (WLCSP) require a z-direction electrical interconnect structure for signal routing and package integration. In some applications, vertical integration for semiconductor packages is achieved by the use of interposers with recesses and TSVs. However, the use of conventional interposers exhibits a number of limitations. Traditional interposer structures include stacking flip chip type semiconductor die over a substrate or printed circuit board (PCB), which increases package height. Interposers often rely exclusively on bumps for electrically connecting to conductive vias, thereby precluding the use of wire bond type connections, redistribution layers (RDLs), and the formation of integrated passive components around the semiconductor die and within the package.

SUMMARY OF THE INVENTION

A need exists for providing a z-direction electrical interconnect structure for signal routing and package integration while decreasing package height, and permitting the use of wire bond type connections, RDLs, and the formation of integrated passive components around the semiconductor die and within the package. Accordingly, in one embodiment, the present invention is a method of making a semiconductor device comprising the steps of providing a substrate, forming a first recess and second recess with a size different from a size of the first recess in a surface of the substrate using a wet etch process, forming a plurality of conductive vias in a surface of the first and second recesses using a dry etch process, and forming a first conductive layer over the surface of the substrate over curved side walls of the first and second recesses and electrically connected to the plurality of conductive vias in the first and second recesses, mounting a first semiconductor die into the first recess, and mounting a second semiconductor die into the second recess. The second semiconductor die has a size different from a size of the first semiconductor die. The first and second semiconductor die are electrically connected to the first conductive layer. The method further includes the steps of depositing an encapsulant into the first and second recesses and around the first and second semiconductor die, removing a portion of the substrate opposite the surface of the substrate to expose the plurality of conductive vias, and forming an interconnect structure electrically connected to the plurality of conductive vias.

In another embodiment, the present invention is a method of making a semiconductor device comprising the steps of providing a substrate, forming a first recess in a surface of the substrate, forming a plurality of conductive vias in a surface of the first recess, forming a first conductive layer over the surface of the substrate over curved side walls of the first recess and electrically connected to the plurality of conductive vias in the first recess, mounting a first semiconductor die into the first recess electrically connected to the first conductive layer, and forming an interconnect structure electrically connected to the plurality of conductive vias.

In another embodiment, the present invention is a method of making a semiconductor device comprising the steps of providing a substrate, forming a first recess in a surface of the substrate, forming a conductive layer over the surface of the substrate and over curved side walls of the first recess, mounting a first semiconductor die into the first recess electrically connected to the conductive layer, and forming an interconnect structure electrically connected to the first semiconductor die.

In another embodiment, the present invention is a semiconductor device comprising a substrate and a first recess formed in a surface of the substrate. A conductive layer is formed over the surface of the substrate and over curved side walls of the first recess. A first semiconductor die is mounted in the first recess and electrically connected to the conductive layer. An interconnect structure is electrically connected to the first semiconductor die.

DETAILED DESCRIPTION OF THE DRAWINGS

Figure 1:
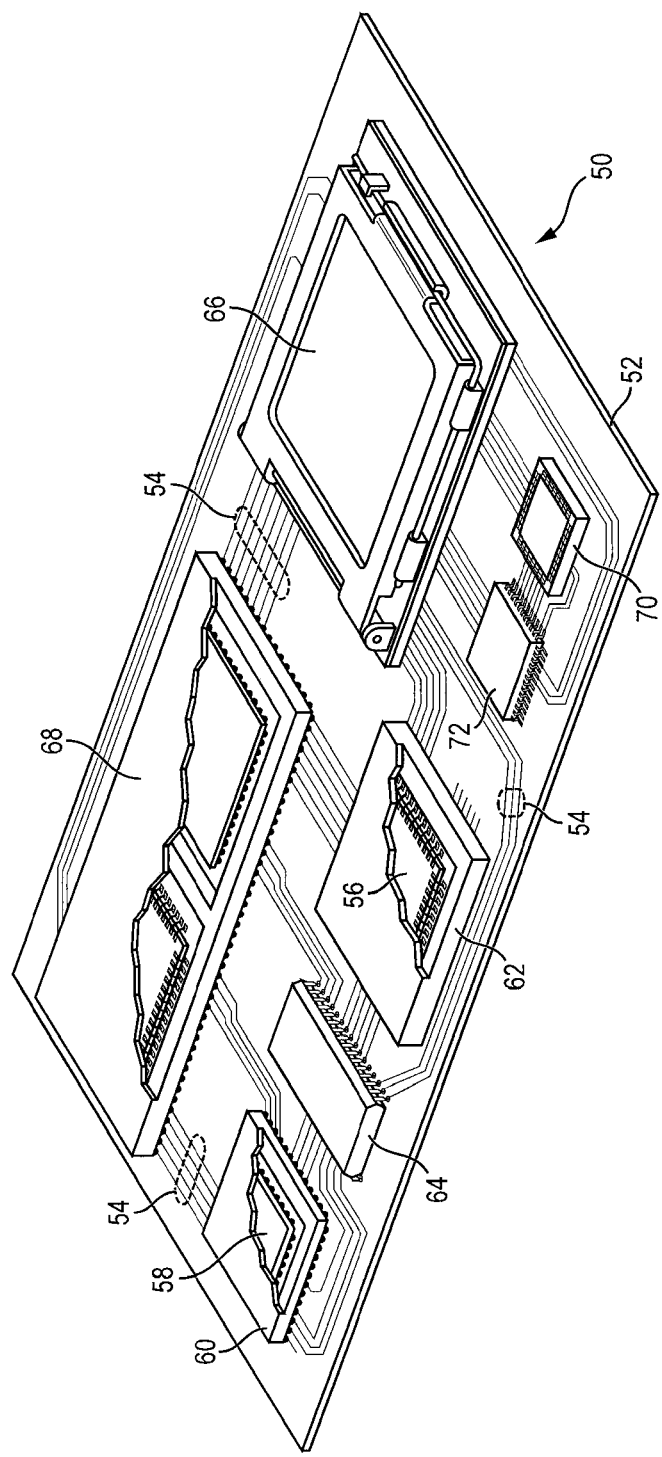
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or bond wires. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
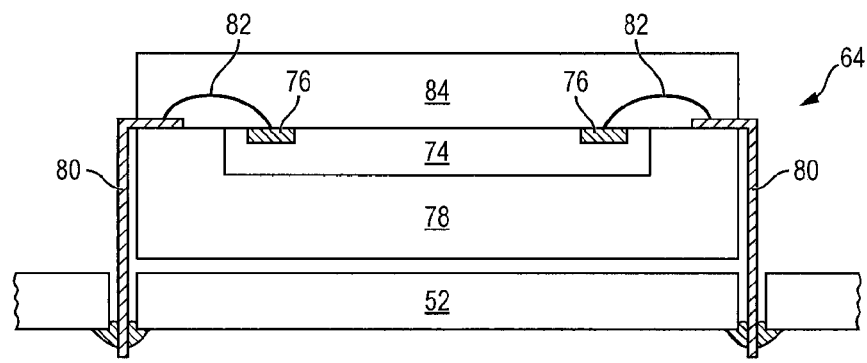
FIGS. 2a-2c illustrate further detail of the semiconductor packages mounted to the PCB.
Figure 2B:
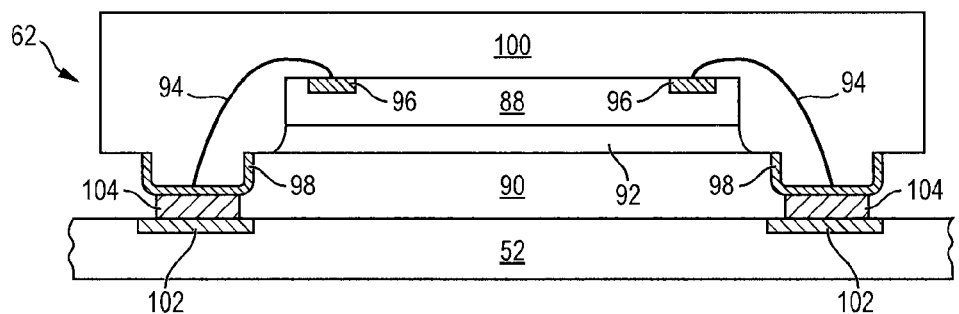
Figure 2C:
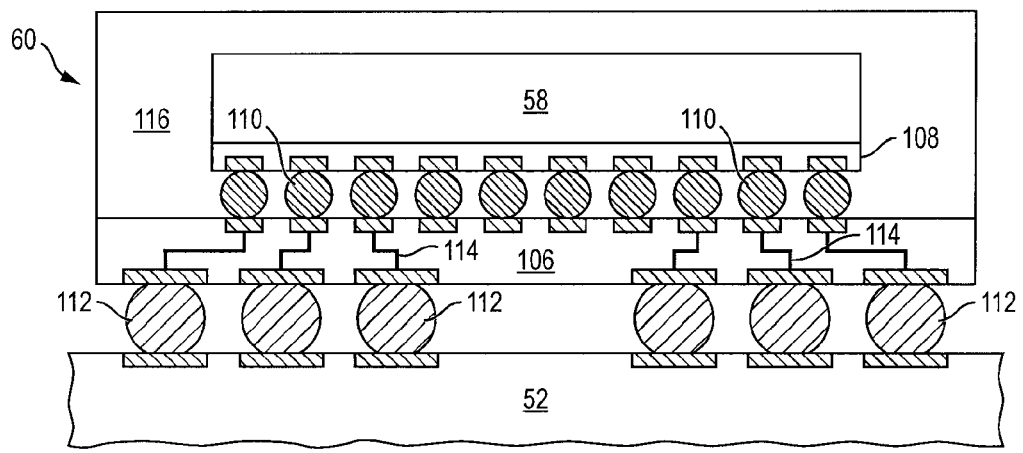

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
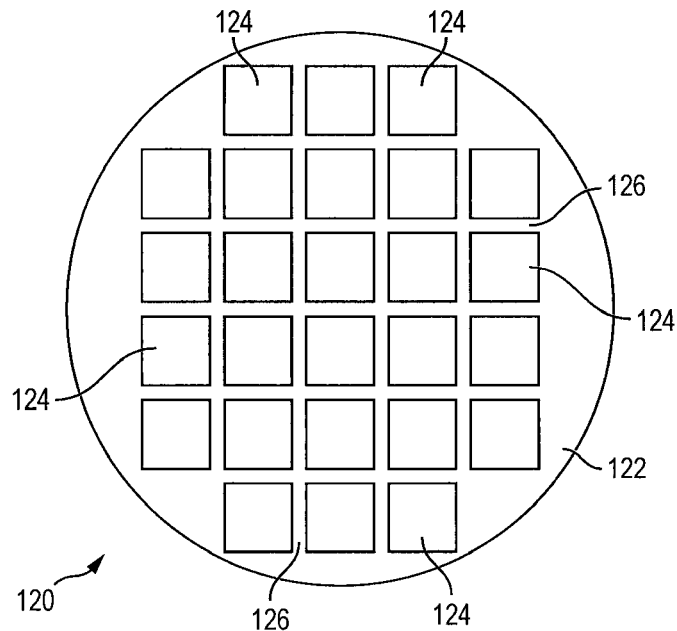
FIGS. 3a-3f illustrate semiconductor wafers with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
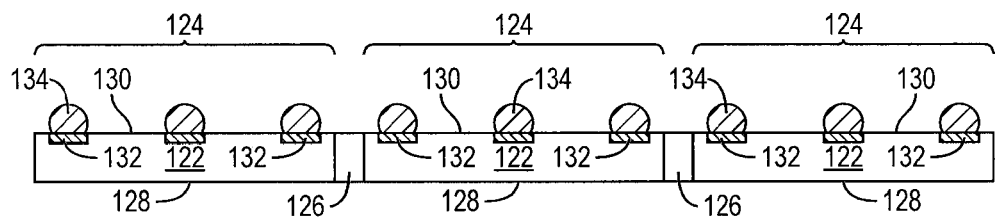

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 130 to implement analog circuits or digital circuits, such as digital signal processor (DSP), ASIC, memory, or other signal processing circuit. Semiconductor die 124 can also contain integrated passive devices (IPDs), such as inductors, capacitors, and resistors, for RF signal processing. Semiconductor die 124 can also be a flip chip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

An electrically conductive bump material is deposited over conductive layer 132 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form spherical balls or bumps 134. In some applications, bumps 134 are reflowed a second time to improve electrical contact to conductive layer 132. Bumps 134 can be formed over an under bump metallization (UBM) having a wetting layer, barrier layer, and adhesive layer. The bumps can also be compression bonded to conductive layer 132. Bumps 134 represent one type of interconnect structure that can be formed over conductive layer 132. The interconnect structure can also use stud bump, micro bump, or other electrical interconnect.

Figure 3C:
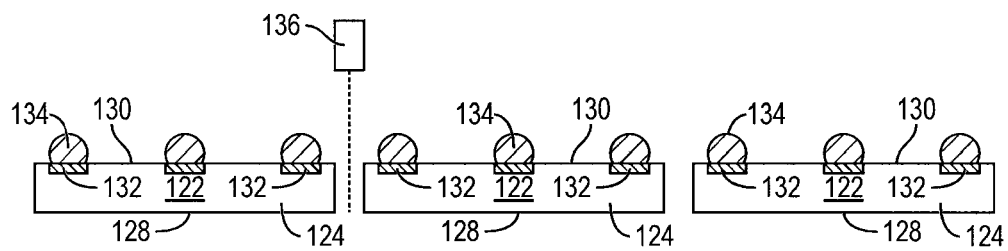

In FIG. 3c, semiconductor wafer 120 is singulated through saw street 126 using a saw blade or laser cutting tool 136 into individual semiconductor die 124.

Figure 3D:
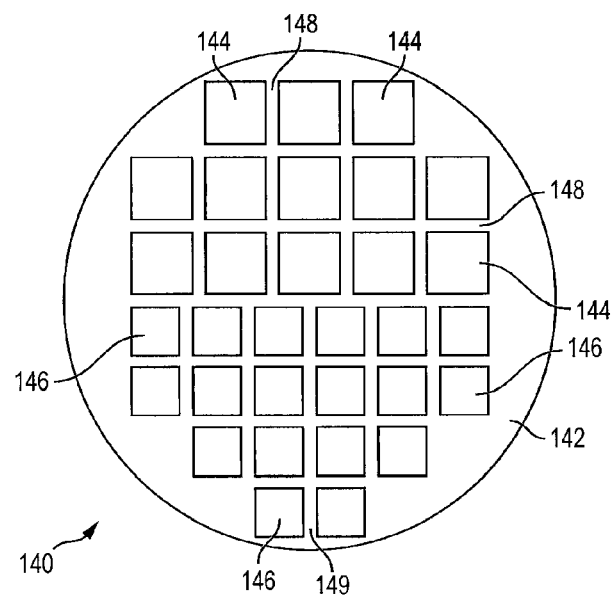

FIG. 3d shows a semiconductor wafer 140 with a base substrate material 142, such as silicon, germanium, gallium arsenide, indium phosphide, or silicon carbide, for structural support. A plurality of semiconductor die or components 144 is formed on a first portion of semiconductor wafer 140. Additionally, a plurality of semiconductor die or components 146 is formed on a second portion of semiconductor wafer 140. Saw streets 148 and 149 separate the plurality of semiconductor die 144 and 146, respectively, as described above. Semiconductor die 144 have a greater die area than semiconductor die 146. Thus, a single semiconductor wafer 140 contains a plurality of semiconductor die 144 and 146 of differing die area. In one embodiment, semiconductor die 144 has a die area one to three times the die area of semiconductor die 146. However, semiconductor die 144 and 146 can be used regardless of the relative sizing between the semiconductor die. Semiconductor die 144 can be formed over one-half of semiconductor wafer 140 and semiconductor die 146 can be formed over a second half of semiconductor wafer 140.

Figure 3E:
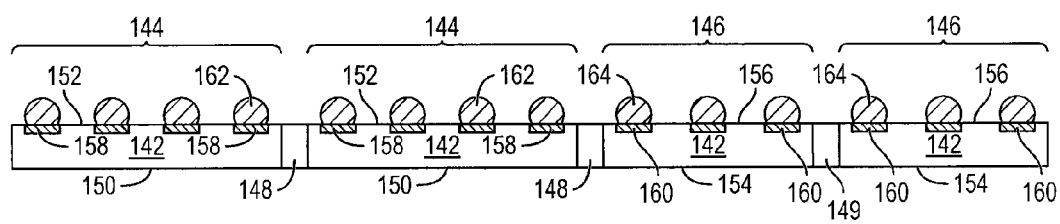

FIG. 3e shows a cross-sectional view of a portion of semiconductor wafer 140. Each semiconductor die 144 has a back surface 150 and an active surface 152. Similarly, each semiconductor die 146 has a back surface 154 and an active surface 156. Active surfaces 152 and 156 contain analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surfaces 152 and 156 to implement analog circuits or digital circuits, such as DSP, ASIC, memory, or other signal processing circuit. Semiconductor die 144 and 146 can also contain IPDs, such as inductors, capacitors, and resistors, for RF signal processing. Semiconductor die 144 and 146 can also be flip chip type semiconductor die.

Electrically conductive layers 158 and 160 are formed over active surface 152 and 156, respectively, using PVD, CVD, electrolytic plating, electroless plating process, or other suitable metal deposition process. Conductive layers 158 and 160 can be one or more layers of Al, Cu, Sn, Ni, Au, Ag, or other suitable electrically conductive material. Conductive layers 158 and 160 operate as contact pads electrically connected to the circuits on active surfaces 152 and 156, respectively. Bumps 162 are formed on contact pads 158, and bumps 164 are formed on contact pads 160.

Figure 3F:
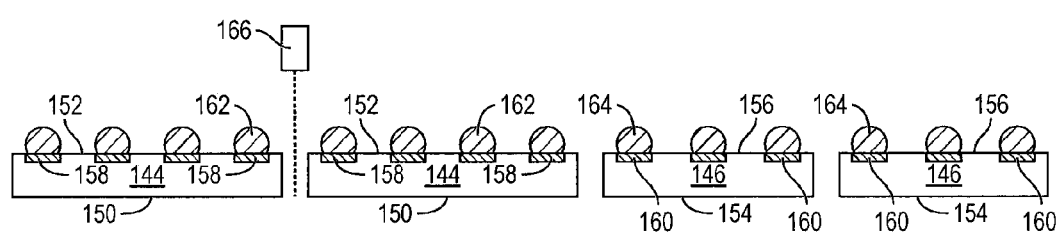

In FIG. 3f, semiconductor wafer 140 is singulated through saw streets 148 and 149 into individual semiconductor die 144 and 146 using a saw blade or laser cutting tool 166.

Figure 4A:
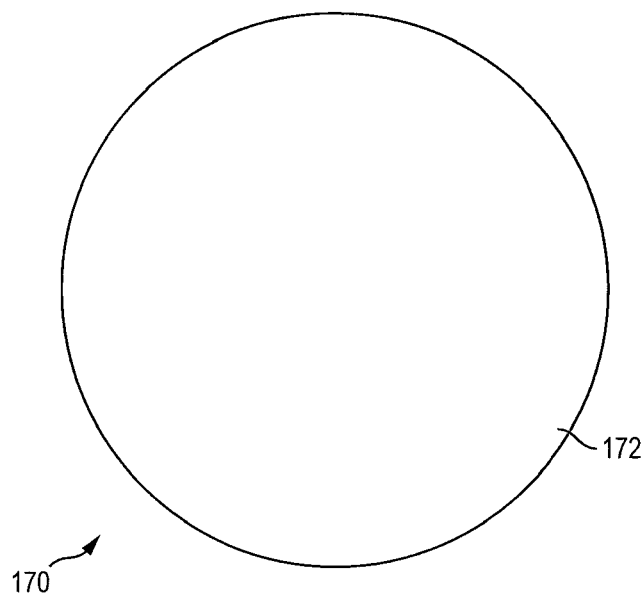
FIGS. 4a-4x illustrate a process of forming a semiconductor device including recesses formed in a substrate for same size or different sized die electrically connected to conductive vias.
Figure 4B:
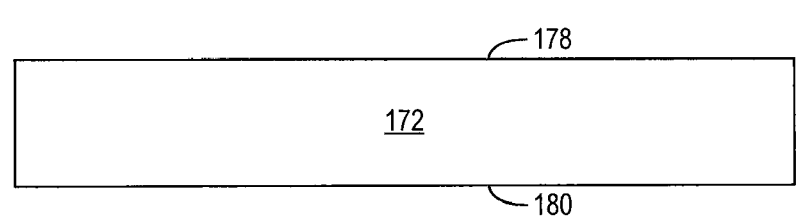
Figure 4C:
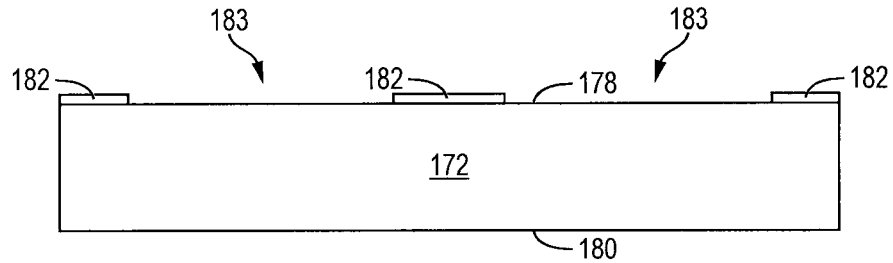
Figure 4D:
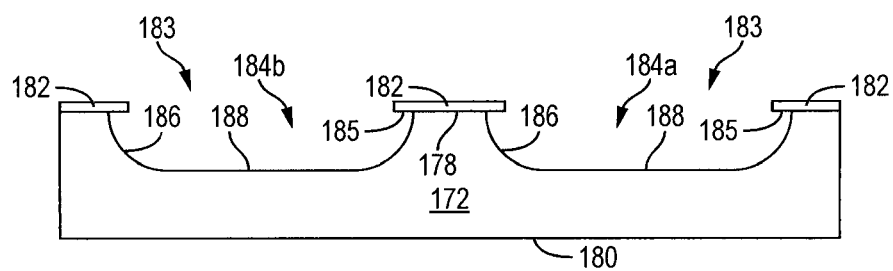
Figure 4E:
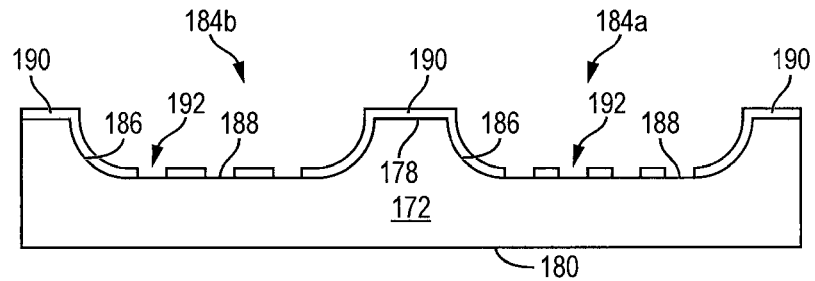
Figure 4F:
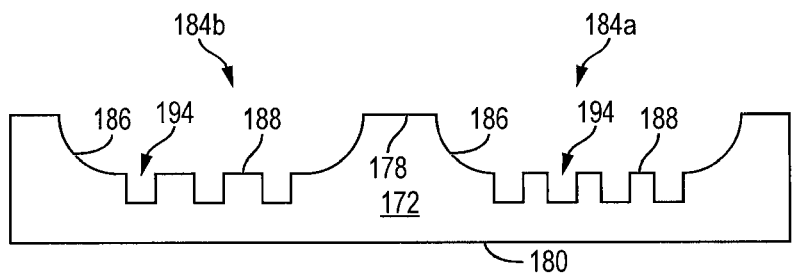
Figure 4G:
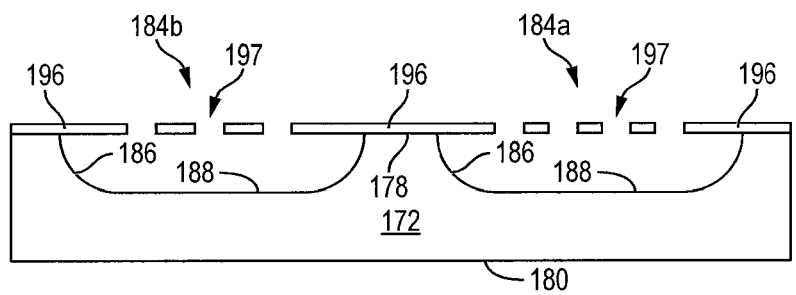
Figure 4H:
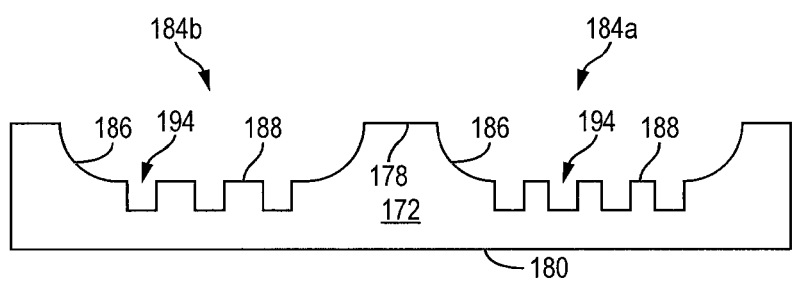
Figure 4I:
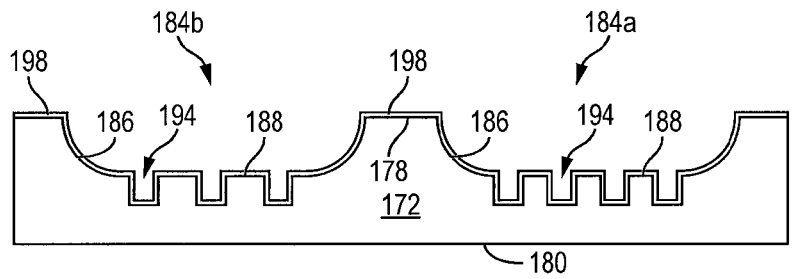
Figure 4J:
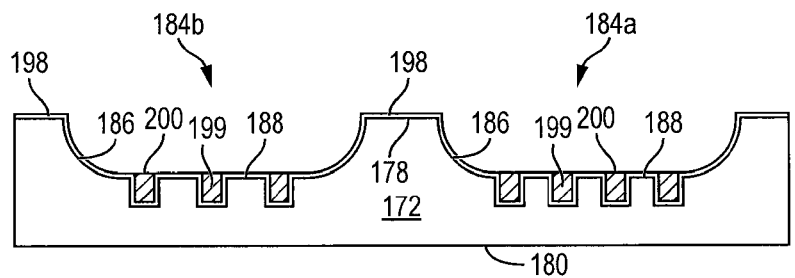
Figure 4K:
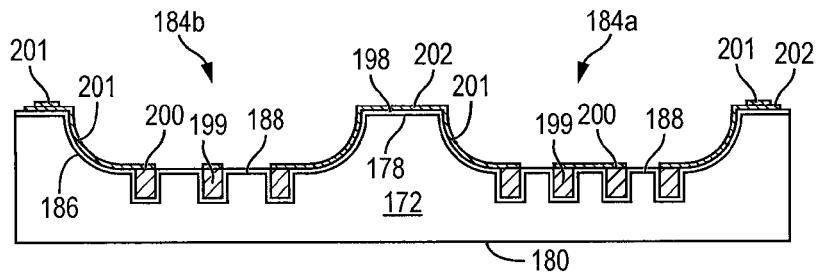
Figure 4L:
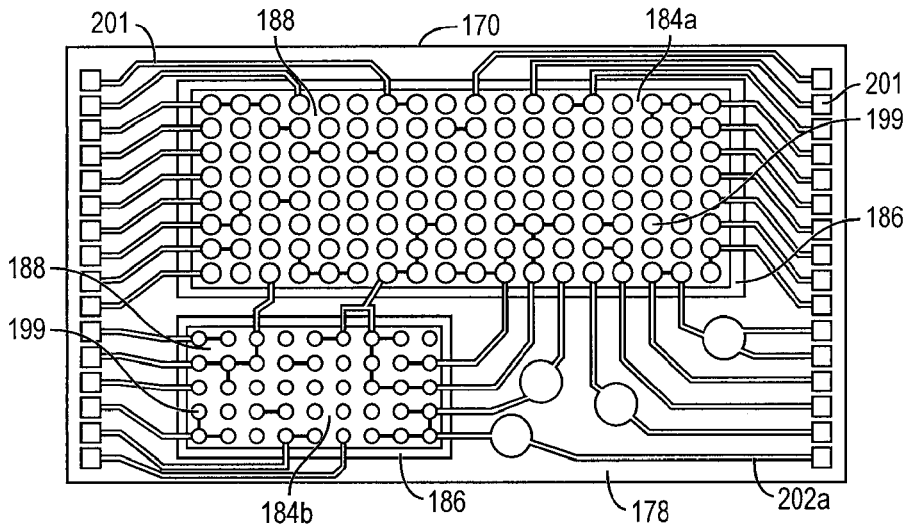
Figure 4M:
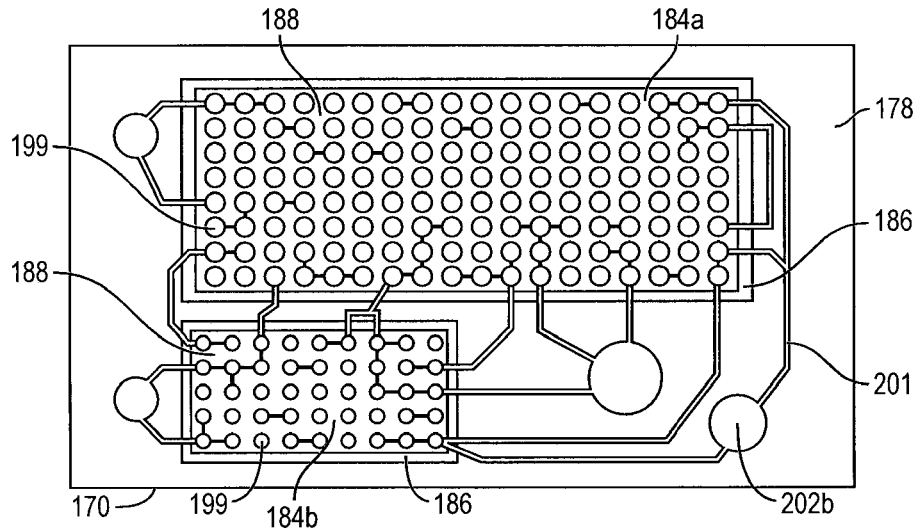
Figure 4N:
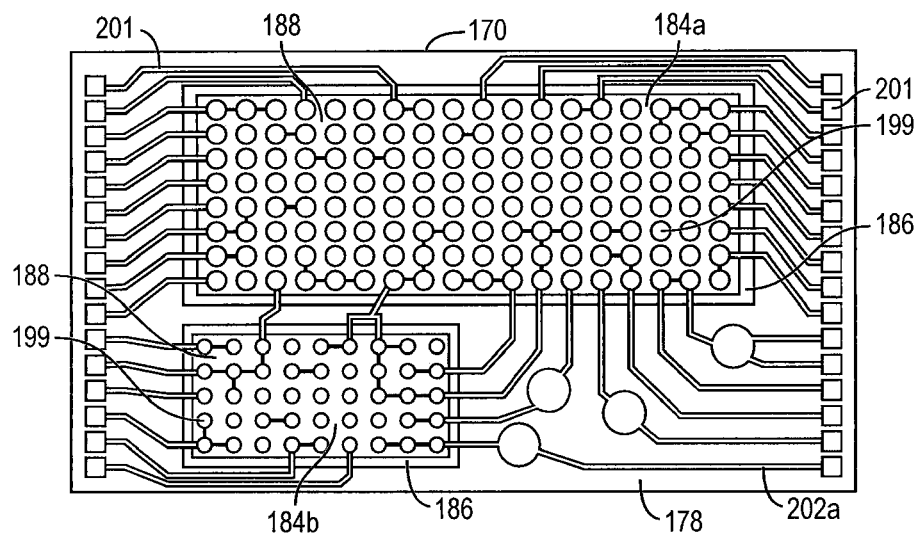
Figure 4O:
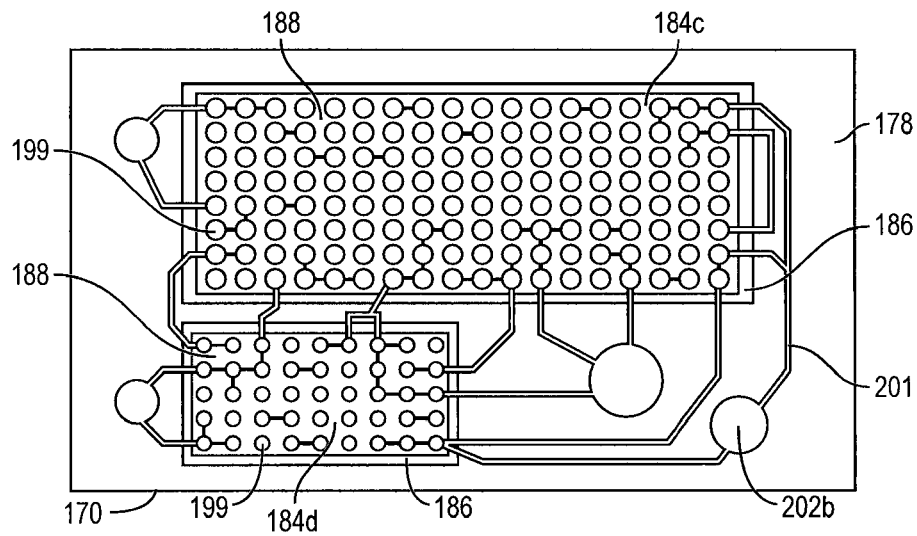
Figure 4P:
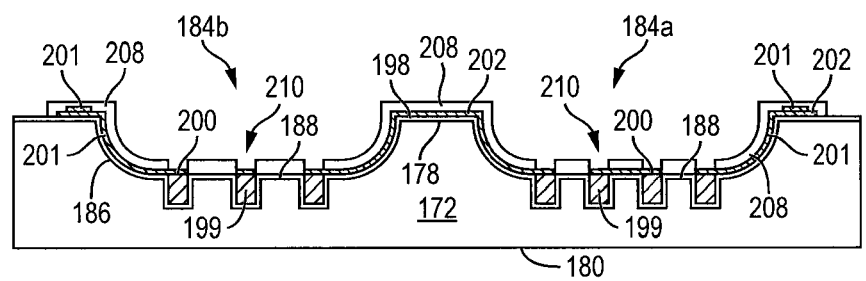
Figure 4Q:
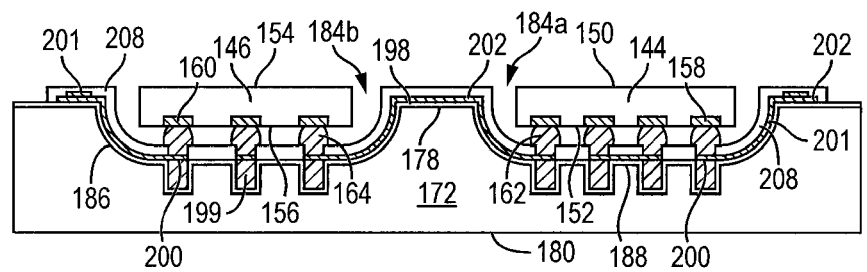
Figure 4R:
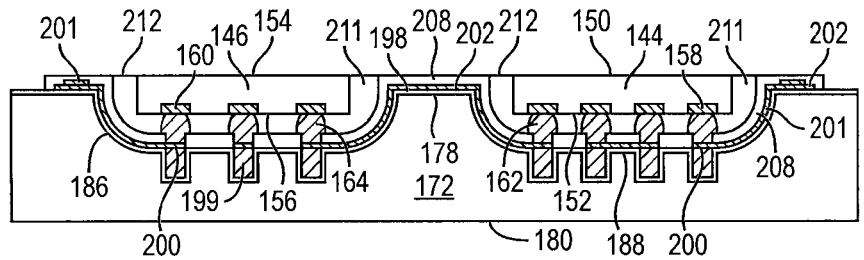
Figure 4S:
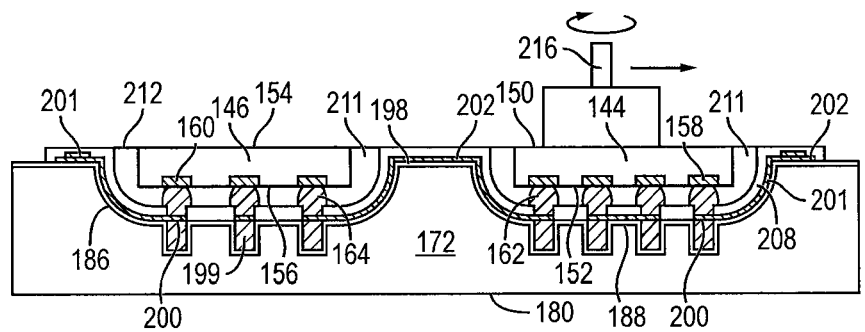
Figure 4T:
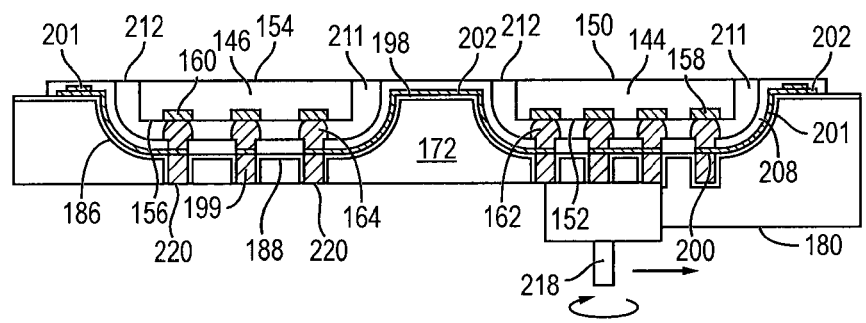
Figure 4U:
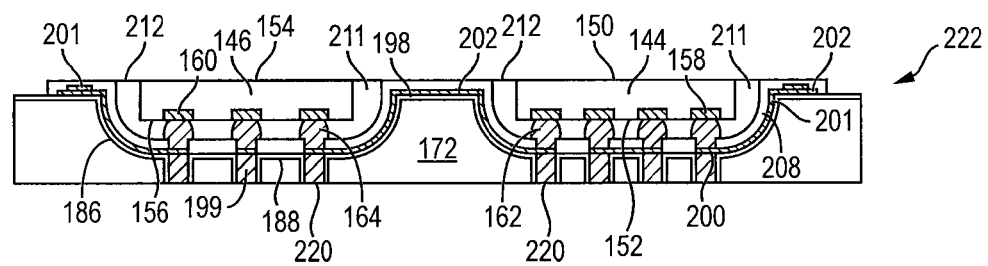
Figure 4V:
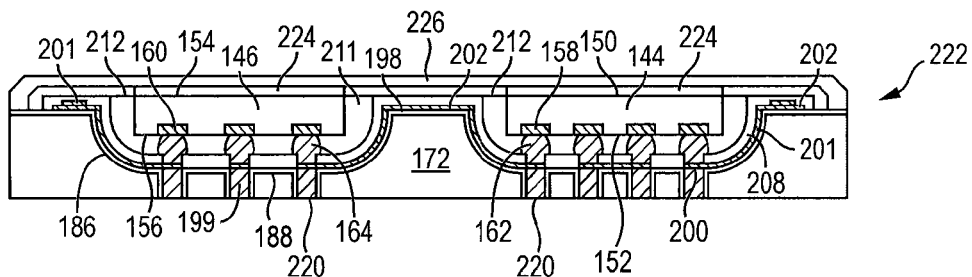
Figure 4W:
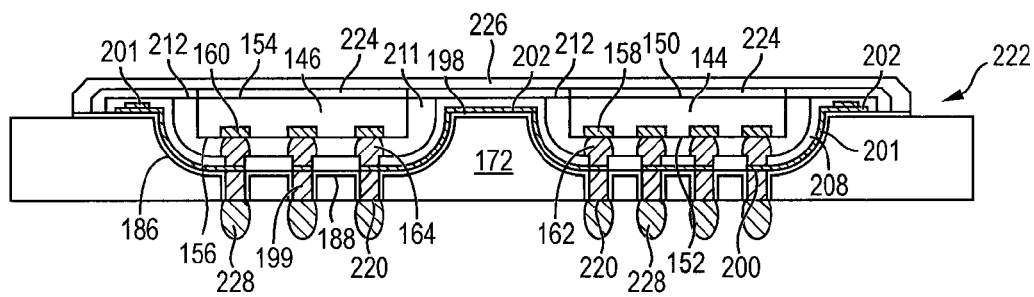
Figure 4X:
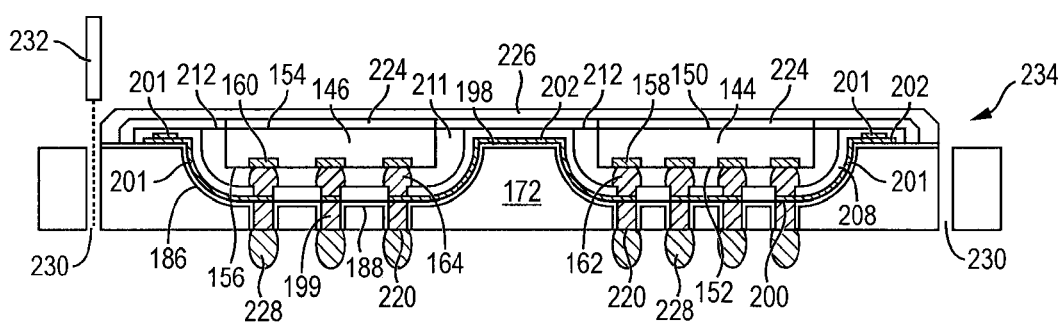

FIGS. 4a-4x illustrate, in relation to FIGS. 1 and 2a-2c, a process of forming a semiconductor device including recesses formed in a substrate for same size or different sized die electrically connected to conductive vias. FIG. 4a shows a semiconductor wafer 170 with a base substrate material 172, such as silicon, germanium, gallium arsenide, indium phosphide, or silicon carbide, for structural support.

FIG. 4b shows a portion of semiconductor wafer 170 made of base substrate material 172 with a top surface 178 and bottom surface 180 that is opposite top surface 178.

In FIG. 4c, a masking layer 182 is formed over top surface 178 of semiconductor wafer 170. Masking layer 182 is patterned and etched to form openings 183 in masking layer 182.

In FIG. 4d, a portion of semiconductor wafer 170 is removed by a wet etch in solution to form recess 184a and recess 184b. Recesses 184a and 184b have sufficient width and depth to contain later mounted semiconductor die 144 and 146, respectively. Recesses 184a and 184b extend partially but not completely through semiconductor wafer 170. The etching process extends recesses 184a and 184b under a portion of masking layer 182, as shown by surface 185. Surface 185 is adjacent to opening 183 and is exposed by recesses 184a and 184b. Thus, after the formation of recesses 184a and 184b, masking layer 182 extends beyond a curved side wall 186 and overhangs recesses 184a and 184b. Curved side wall 186 includes varying degrees of curvature and can be angled rather than curved. Curved side wall 186 has a smooth surface, profile, and contour that facilitate trace formation. Recesses 184a and 184b include a via land or bottom recess surface 188 that is substantially flat and has an area that is sufficiently large to contain later formed vias and later mounted semiconductor die 144 and 146, respectively. After recesses 184a and 184b are formed, masking layer 182 is removed. By using a wet etch in solution process for forming recesses 184a and 184b rather than a dry etch process, cost savings are realized. Additionally, the formation of recesses 184a and 184b also reduces the amount of material 172 that must be removed during a later backgrinding step.

In FIG. 4e, a masking layer 190 is formed over semiconductor wafer 170, including on top surface 178, curved side wall 186, and bottom recess surface 188. The smooth surface of bottom recess surface 188, resulting from the wet etch process, facilitates the formation of masking layer 190. Masking layer 190 is patterned and etched to form openings 192 in the masking layer over bottom recess surface 188. Openings 192 facilitate the later formation of vias and are formed at a distance from curved side wall 186.

In FIG. 4f, a plurality of vias 194 is formed by removing a portion of semiconductor wafer 170 by a dry etch process. Vias 194 are configured along bottom recess surface 188 according to the placement of openings 192. Vias 194 extend partially but not completely through semiconductor wafer 170. The number, placement, and orientation of vias 194 differ between recesses 184a and 184b. After the formation of vias 194, masking layer 190 is removed.

FIGS. 4g-4h show another method of forming vias 194 in semiconductor wafer 170. In FIG. 4g, a mask 196 is positioned over semiconductor wafer 170. Mask 196 is made of metal, or alternatively, is made of solder resist or other suitable material. Mask 196 includes openings 197, which facilitate the later formation of vias 194. Mask 196 is positioned over, and can be mounted to, semiconductor wafer 170 to align openings 197 over bottom recess surface 188.

In FIG. 4h, a plurality of vias 194 is formed by a dry etch process. The dry etch process includes removing a portion of semiconductor wafer 170 beginning at bottom recess surface 188 and extending partially but not completely through semiconductor wafer 170. Vias 194 are configured along bottom recess surface 188 according to the placement of openings 197. The number, placement, and orientation of vias 194 differs between recesses 184a and 184b. After the formation of vias 194, mask 196 is removed.

In FIG. 4i, an insulation or passivation layer 198 is conformally applied over semiconductor wafer 170 using PVD, CVD, screen printing, spin coating, spray coating, sintering or thermal oxidation. Insulation layer 198 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Insulation layer 198 follows the contours of, and uniformly covers, vias 194, bottom recess surface 188, curved side wall 186, and top surface 178.

In FIG. 4j, vias 194 are filled with Al, Cu, Sn, Ni, Au, Ag, titanium (Ti), tungsten (W), poly-silicon, or other suitable electrically conductive material using PVD, CVD, electrolytic plating, electroless plating process, or other suitable metal deposition process to form z-direction vertical conductive through silicon vias (TSVs) 199. TSVs 199 have a top surface 200 that is substantially coplanar with a portion of insulation layer 198 that is formed on bottom recess surface 188. TSVs 199 can also be formed with an optional seed layer.

In FIG. 4k, an electrically conductive layer or RDL 201 is formed over insulation layer 198 using a patterning and metal deposition process such as printing, PVD, CVD, sputtering, electrolytic plating, and electroless plating. Conductive layer 201 can be one or more layers of Al, Cu, Sn, Ni, Au, Ag, or other suitable electrically conductive material. Conductive layer 201 is formed over, and follows the contours of, bottom recess surface 188, TSV top surface 200, curved side wall 186, and top surface 178. Conductive layer 201 electrically connects to TSVs 199 and provides an electrical path from the TSVs to over top surface 178 for electrical interconnect of the later mounted semiconductor die 144 and 146. The electrical path of conductive layer 201 follows the contours of curved side wall 186. The smooth contours of curved side wall 186 facilitate the formation of conductive layer 201 from over bottom recess surface 188 to over top surface 178. The geometry of curved side wall 186 provides good reliability for the portion of conductive layer 201 formed over the curved side wall. Furthermore, portions of conductive layer 201 can be electrically common or electrically isolated depending on the design and function of the later mounted semiconductor die 144 and 146.

Conductive layer 201 also forms a portion of passive pattern 202 over top surface 178 of semiconductor wafer 170. The formation of passive pattern 202 allows for the formation of embedded passive components, such as inductors, capacitors, and resistors, resulting in passive components with good electrical properties without the use of surface mount technology (SMT). Passive pattern 202 includes various shapes such as a spiral or quadrilateral shape. Furthermore, passive pattern 202 can be shaped and sized to improve electrical properties and spacing of the embedded passive components. The formation of passive pattern 202 reduces the cost of passive component formation, and the need to provide an additional package substrate, thereby further reducing cost. Furthermore, the configuration of passive pattern 202 can be easily modified by changing only a mask and process used to form passive pattern 202.

FIG. 4l shows a top view of a first embodiment of FIG. 4k, including a portion of semiconductor wafer 170 with recesses 184a and 184b. Semiconductor wafer 170 includes a plurality of recesses 184a and 184b formed in both a first portion and a second portion of semiconductor wafer 170. Recesses 184a and 184b differ in recess area and have sufficient width and depth to contain later mounted semiconductor die 144 and 146, respectively. Thus, recess 184a has a larger area than recess 184b. Recesses 184a and 184b include curved side wall 186, which includes smooth contours that facilitate the formation of conductive layer 201 from over bottom recess surface 188 to over top surface 178. The geometry of curved side wall 186 provides good reliability for the portion of conductive layer 201 formed over the curved side wall. Recesses 184a and 184b also include via land or bottom recess surface 188 that is substantially flat and contains TSVs 199 for connection to later mounted semiconductor die 144 and 146, respectively. TSVs 199 are also electrically connected to conductive layer 201, which provides an electrical path to passive pattern 202a.

Passive pattern 202a is formed over semiconductor wafer 170 and around recesses 184a and 184b on the first portion of the semiconductor wafer. In one application, passive pattern 202a can be formed over one-half of semiconductor wafer 170. Passive pattern 202a allows for the formation of embedded passive components such as inductors, capacitors, and resistors resulting in good electrical properties without the use of SMT. The configuration of passive pattern 202a can be easily modified by changing only the mask and process used to form passive pattern 202, and provides passive components of good reliability.

FIG. 4m shows a top view of a second embodiment of FIG. 4k, including a portion of semiconductor wafer 170 with recesses 184a and 184b. Semiconductor wafer 170 includes a plurality of recesses 184a and 184b formed in both a first and second portion of semiconductor wafer 170. Recesses 184a and 184b have sufficient width and depth to contain later mounted semiconductor die 144 and 146, respectively. Thus, recess 184a has a larger area than recess 184b. Recesses 184a and 184b include curved side wall 186, which includes smooth contours that facilitate the formation of conductive layer 201 from over bottom recess surface 188 to over top surface 178. The geometry of curved side wall 186 provides good reliability for the portion of conductive layer 201 formed over the curved side wall. Recesses 184a and 184b also include via land or bottom recess surface 188 that is substantially flat and contains TSVs 199 for connection to later mounted semiconductor die 144 and 146, respectively. TSVs 199 are also electrically connected to conductive layer 201, which provides an electrical path to passive pattern 202b.

Passive pattern 202b is formed over semiconductor wafer 170 and around recesses 184a and 184b on the second portion of the semiconductor wafer. Passive pattern 202b differs from passive pattern 202a, and can be formed over one-half of semiconductor wafer 170. Passive pattern 202b allows for the formation of embedded passive components such as inductors, capacitors, and resistors resulting in good electrical properties without the use of SMT. The configuration of passive pattern 202b can be easily modified by changing only the mask and process used to form passive pattern 202, and provides passive components of good reliability. Passive patterns 202a and 202b are combined on a single semiconductor wafer 170, wherein passive pattern 202a can be formed on a first half of the semiconductor wafer, and passive pattern 202b can be formed on the second half of the semiconductor wafer.

FIG. 4n shows a top view of a third embodiment of FIG. 4k, including a portion of semiconductor wafer 170 with recesses 184a and 184b. Semiconductor wafer 170 includes a plurality of recesses 184a and 184b formed in only a first portion of semiconductor wafer 170. Recesses 184a and 184b have sufficient width and depth to contain later mounted semiconductor die 144 and 146, respectively. Thus, recess 184a has a larger area than recess 184b. Recesses 184a and 184b include curved side wall 186, which includes smooth contours that facilitate the formation of conductive layer 201 from over bottom recess surface 188 to over top surface 178. The geometry of curved side wall 186 provides good reliability for the portion of conductive layer 201 formed over the curved side wall. Recesses 184a and 184b also include via land or bottom recess surface 188 that is substantially flat and contains TSVs 199 for connection to later mounted semiconductor die 144 and 146, respectively. TSVs 199 are also electrically connected to conductive layer 201, which provides an electrical path to passive pattern 202a.

Passive pattern 202a is formed over semiconductor wafer 170 and around recesses 184a and 184b on the first portion of the semiconductor wafer. In one application, passive pattern 202a can be formed over one-half of semiconductor wafer 170. Passive pattern 202a allows for the formation of embedded passive components such as inductors, capacitors, and resistors resulting in good electrical properties without the use of SMT. The configuration of passive pattern 202a can be easily modified by changing only the mask and process used to form passive pattern 202, and provides passive components of good reliability.

FIG. 4o shows a top view of a fourth embodiment of FIG. 4k, including a portion of semiconductor wafer 170 with recesses 184c and 184d. Recesses 184c and 184d are formed in a second portion of semiconductor wafer 170. Recess 184c has a larger recess area than recess 184d. Recesses 184c and 184d also differ in recess area from recesses 184a and 184b, and have sufficient width and depth to contain later mounted semiconductor die. In one embodiment, recesses 184c and 184d have a recess area one to three times the recess area of recesses 184a and 184b. However, regardless of the relative sizing of recesses 184c and 184d with respect to recesses 184a and 184b, recesses 184c and 184d include curved side wall 186, which includes smooth contours that facilitate the formation of conductive layer 201 from over bottom recess surface 188 to over top surface 178. The geometry of curved side wall 186 provides good reliability for the portion of conductive layer 201 formed over the curved side wall. Recesses 184c and 184d also include via land or bottom recess surface 188 that is substantially flat and contains TSVs 199 for connection to later mounted semiconductor die. TSVs 199 are also electrically connected to conductive layer 201, which provides an electrical path to passive pattern 202b.

Passive pattern 202b is formed over semiconductor wafer 170 and around recesses 184c and 184d on the second portion of the semiconductor wafer. Passive pattern 202b differs from passive pattern 202a, and can be formed over one-half of semiconductor wafer 170. Passive pattern 202b allows for the formation of embedded passive components such as inductors, capacitors, and resistors resulting in good electrical properties without the use of SMT. The configuration of passive pattern 202b can be easily modified by changing only the mask and process used to form passive pattern 202, and provides passive components of good reliability. Passive patterns 202a and 202b are combined on a single semiconductor wafer 170, with recesses of different sizes. In one application, passive pattern 202a is formed on the first half of semiconductor wafer 170 with recesses 184a and 184b, and passive pattern 202b is formed on the second half of the semiconductor wafer with recesses 184c and 184d.

In FIG. 4p, an insulation or passivation layer 208 is conformally applied over semiconductor wafer 170 and over conductive layer 201 using PVD, CVD, screen printing, spin coating, spray coating, sintering or thermal oxidation. Insulating layer 208 contains one or more layers of SiO2, Si3N4, SiON, Ta2O5, Al2O3, or other material having similar insulating and structural properties. Insulating layer 208 follows the contours of, and uniformly covers, conductive layer 201, bottom recess surface 188, curved side wall 186, and top surface 178. Portions of insulating layer 208 are subsequently removed to form openings 210 in the insulating layer, thereby exposing portions of conductive layer 201.

In FIG. 4q, semiconductor die 144 and 146 from FIGS. 3d-3f are mounted into recesses 184a and 184b, with active surface 152 and 156, respectively, oriented toward bottom recess surface 188 of semiconductor wafer 170. Recesses 184a and 184b are different sizes in order to accommodate the function and design of semiconductor die 144 and 146. Recess 184a is larger than recess 184b in order to accommodate semiconductor die 144, which is larger than semiconductor die 146. Recesses 184a and 184b are also sized to accommodate a gap between sidewall 186 and the semiconductor die. In one embodiment, back surfaces 150 and 154 of semiconductor die 144 and 146, respectively, are positioned below a surface substantially coplanar with a portion of insulation layer 208 formed over top surface 178 of semiconductor wafer 170. That is, the entirety of semiconductor die 144 and 146 are within recesses 184a and 184b, respectively.

Alternatively, back surfaces 150 and 154 of semiconductor die 144 and 146 are positioned over a surface substantially coplanar with a portion of insulation layer 208 formed over top surface 178 of semiconductor wafer 170. Thus, semiconductor die 144 and 146 are partially within recesses 184a and 184b, respectively. When semiconductor die 144, semiconductor die 146, and semiconductor wafer 170 are all made of silicon, differences in coefficients of thermal expansion (CTE) are reduced.

Bumps 162 and 164 of semiconductor die 144 and 146, respectively, are metallurgically and electrically connected to conductive layer 201 through openings 210 in insulation layer 208. Therefore, semiconductor die 144 and 146 are also electrically connected to TSVs 199, and passive pattern 202.

In FIG. 4r, an encapsulant or molding compound 211 is deposited into recesses 184a and 184b and around semiconductor die 144 and 146 using a paste printing, compressive molding, transfer molding, liquid encapsulant molding, vacuum lamination, spin coating, or other suitable applicator. Encapsulant 211 can be polymer composite material, such as epoxy resin with filler, epoxy acrylate with filler, or polymer with proper filler. Encapsulant 211 is non-conductive and environmentally protects semiconductor device 144 and 146 from external elements and contaminants. Surface 212 of encapsulant 211 can be substantially coplanar with back surface 154 of semiconductor die 146 and back surface 150 of semiconductor die 144. Alternatively, surface 212 of encapsulant 211 can be substantially coplanar with the portion of insulation layer 208 formed over top surface 178 of semiconductor wafer 170.

Encapsulant 211 also fills a space between active surface 152 and insulation layer 208 around bumps 162 of semiconductor die 144. Similarly, encapsulant 211 fills a space between active surface 156 and insulation layer 208 around bumps 164 of semiconductor die 146. In another embodiment, an underfill material, rather than an encapsulant, is deposited between active surface 152 and insulation layer 208 around bumps 162. The underfill material is also deposited between active surface 156 and insulation layer 208 around bumps 164.

In FIG. 4s, surfaces 150, 154, and 212 undergo a grinding operation with grinder 216 to planarize back surface 150 of semiconductor die 144, back surface 154 of semiconductor die 146, and surface 212 of encapsulant 211. The planarization of surfaces 150, 154, and 212 removes material from the surface of the WLCSP and produces a uniformly flat surface, without exposing passive pattern 202, or conductive layer 201. The planarization process can also remove a portion of insulation layer 208.

In FIG. 4t, bottom surface 180 of semiconductor wafer 170 undergoes a grinding operation with grinder 218 to expose a bottom surface 220 of TSVs 199 and to reduce the height of semiconductor wafer 170.

FIG. 4u shows an unsingulated WLCSP 222 after the back grinding operation.

In FIG. 4v, a thermal interface material (TIM) 224 such as thermal epoxy, thermal epoxy resin, or thermal conductive paste is formed on back surface 150 of semiconductor die 144, and on back surface 154 of semiconductor die 146 of WLCSP 222. Heat spreader 226 is mounted over semiconductor die 144 and 146, conductive layer 201, and insulation layer 208, and is connected to TIM 224 and to semiconductor wafer 170. Heat spreader 226 can be Cu, Al, or other material with high thermal conductivity. TIM 224 and heat spreader 226 form a thermally conductive path that aids with distribution and dissipation of heat generated by semiconductor die 144 and 146 and increases the thermal performance of WLCSP 222.

In FIG. 4w, an electrically conductive bump material is deposited over bottom surface 220 of TSVs 199 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bottom surface 220 of TSVs 199 using a suitable attachment or bonding process. In one embodiment, the bump material is reflowed by heating the material above its melting point to form spherical balls or bumps 228. In some applications, bumps 228 are reflowed a second time to improve electrical contact to bottom surface 220 of TSVs 199. Bumps 228 can be formed over a UBM having a wetting layer, barrier layer, and adhesive layer. The bumps can also be compression bonded to bottom surface 220 of TSVs 199. Bumps 228 represent one type of interconnect structure that can be formed over bottom surface 220 of TSVs 199. The interconnect structure can also use stud bump, micro bump, or other electrical interconnect.

With the formation of bumps 228, the WLCSP can be connected to external semiconductor devices, and electrical signals are transmitted from bumps 228, through TSVs 199, conductive layer 201, and bumps 162 and 164 to semiconductor die 144 and 146, respectively. Additionally, electrical signals are transmitted from bumps 228, through TSVs 199 and conductive layer 201, to passive pattern 202.

In FIG. 4x, semiconductor wafer 170 is singulated through saw streets 230 with saw blade or laser cutting tool 232, to form individual WLCSP 234. As part of WLCSP 234 semiconductor die 144 and 146 are electrically connected to conductive bumps 228 for connection to external semiconductor devices without the use of additional intermediate structures. By omitting intermediate structures such as a PCB, cost savings are realized. Cost savings are also realized by using a wet etch in solution process for forming recess 184a and 184b rather than a dry etch process. Within WLCSP 234 the smooth surface of bottom recess surface 188, resulting from the wet etch process, facilitates the formation of masking layer 190. Similarly, the smooth contours of curved side wall 186 facilitate the formation of conductive layer 201 between the portion of conductive layer 201 formed over bottom recess surface 188 and top surface 178, and provide good reliability due to the geometry of the curved side wall. Conductive layer 201 also forms a portion of passive pattern 202, which allows for the formation of embedded passive components, such as inductors, capacitors, and resistors, resulting in good electrical properties without the use of SMT. Furthermore, the configuration of passive pattern 202 can be easily modified by changing only the mask and process used to form the passive pattern, thereby reducing cost and increasing productivity.

Productivity is also increased because the recited steps are all wafer level processes. During one of the wafer level processes, a fiducial or align mark is made on substrate 170 to aid with the alignment of semiconductor die 144 and 146 to the substrate. Semiconductor die 144 and 146 are formed on semiconductor wafer 140, which can be a thin silicon wafer. Semiconductor wafer 170, to which semiconductor die 144 and 146 are mounted, can also be a thin silicon wafer thereby reducing the overall height of WLCSP 234. The grinding operation shown in FIG. 4t further reduces the height of WLCSP 234. Additionally, because semiconductor die 144, semiconductor die 146, and semiconductor wafer 170 can all be made of silicon, differences in CTE are reduced. Finally, TIM 224 and heat spreader 226 increase the thermal performance of WLCSP 234.

Figure 5A:
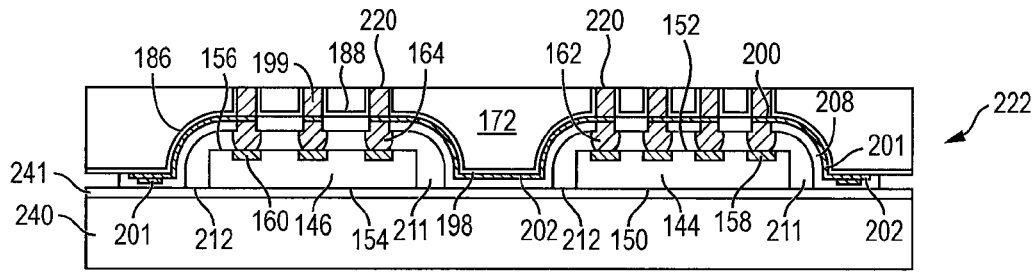
FIGS. 5a-5f illustrate a process of forming an interconnect structure over a surface of the semiconductor device substrate.

FIGS. 5*a*-5*f* show another embodiment, continuing from FIG. 4*u*, with substrate or carrier 240 containing temporary or sacrificial base material such as silicon, polymer, beryllium oxide, laminate, or other suitable low-cost, rigid material for structural support. In FIG. 5*a*, an interface layer or double-sided tape 241 is formed over carrier 240 as a temporary adhesive bonding film or etch-stop layer. Semiconductor wafer 170 is mounted to carrier 240, with back surfaces 150 and 154 of semiconductor die 144 and 146, respectively, oriented toward interface layer 241.

Figure 5B:
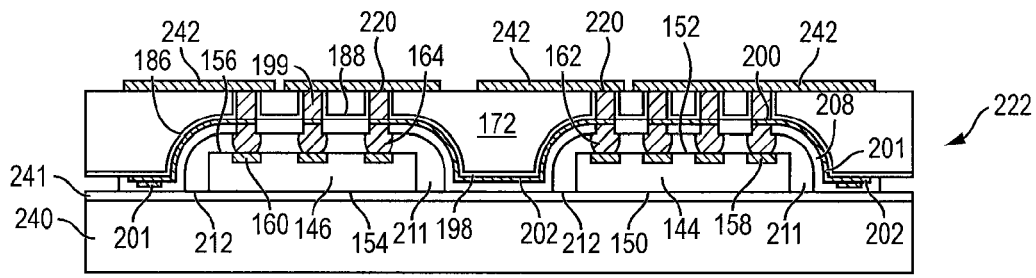

In FIG. 5*b*, an electrically conductive layer or RDL 242 is formed over semiconductor wafer 170 and bottom surface 220 of TSVs 199 using a patterning and metal deposition process such as printing, PVD, CVD, sputtering, electrolytic plating, and electroless plating. Conductive layer 242 can be one or more layers of Al, Cu, Sn, Ni, Au, Ag, or other suitable electrically conductive material. Conductive layer 242 electrically connects to TSVs 199 and provides an electrical path connecting to conductive layer 201, passive pattern 202, and semiconductor die 144 and 146. Portions of conductive layer 242 can be electrically common or electrically isolated depending on the design and functionality of semiconductor die 144 and 146.

Figure 5C:
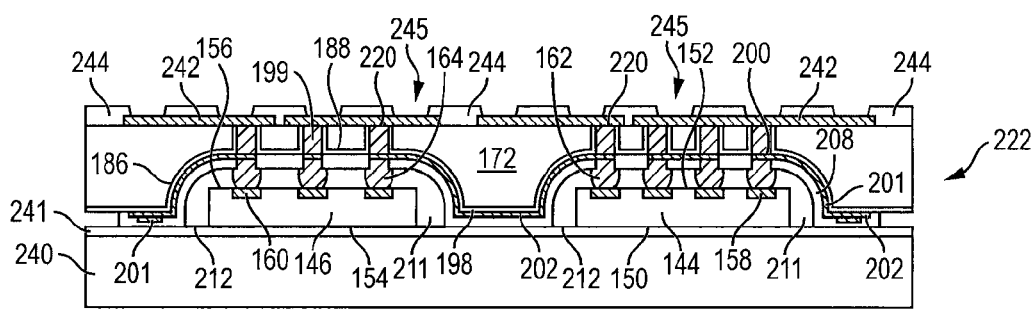

In FIG. 5*c*, an insulation or passivation layer 244 is conformally applied over semiconductor wafer 170 and over conductive layer 242 using PVD, CVD, screen printing, spin coating, spray coating, sintering or thermal oxidation. Insulating layer 244 contains one or more layers of SiO2, Si3N4, SiON, Ta2O5, Al2O3, or other material having similar insulating and structural properties. Insulating layer 244 follows the contours of, and uniformly covers, conductive layer 242, and semiconductor wafer 170. Portions of insulating layer 244 are subsequently removed to form openings 245 in the insulating layer, thereby exposing portions of conductive layer 242 for later formation of bumps.

Figure 5D:
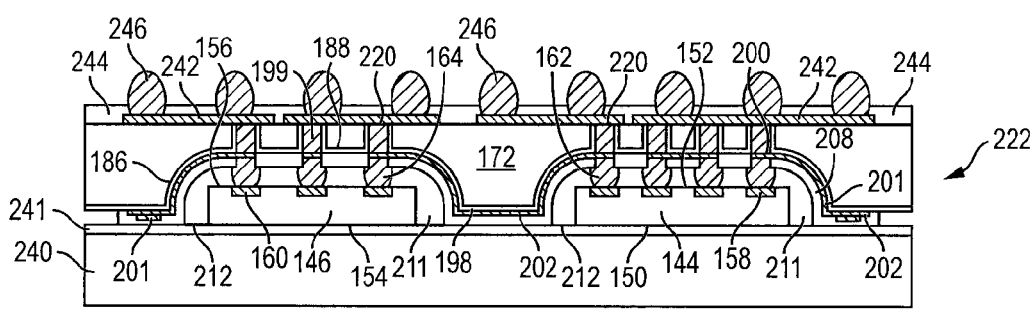

In FIG. 5*d*, an electrically conductive bump material is deposited over conductive layer 242 and in openings 245 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 242 using a suitable attachment or bonding process. In one embodiment, the bump material is reflowed by heating the material above its melting point to form spherical balls or bumps 246. In some applications, bumps 246 are reflowed a second time to improve electrical contact to conductive layer 242. Bumps 246 can be formed over a UBM having a wetting layer, barrier layer, and adhesive layer. The bumps can also be compression bonded to conductive layer 242. Bumps 246 represent one type of interconnect structure that can be formed over conductive layer 242. The interconnect structure can also use stud bump, micro bump, or other electrical interconnect.

With the formation of bumps 246, the WLCSP can be connected to external semiconductor devices, and electrical signals are then transmitted from bumps 246, through conductive layer 242, TSVs 199, conductive layer 201, and bumps 162 and 164 to semiconductor die 144 and 146, respectively. Additionally, electrical signals are transmitted from bumps 246, through TSVs 199 and conductive layer 201, to passive pattern 202.

Figure 5E:
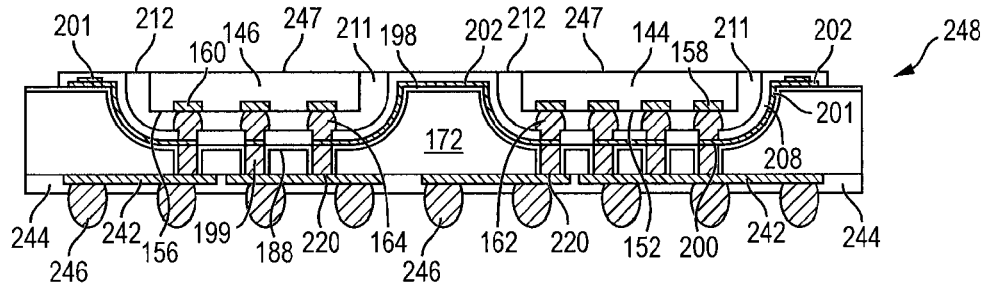

In FIG. 5*e*, carrier 240 and interface layer 241 are removed by chemical etching, mechanical peeling, CMP, mechanical grinding, thermal bake, UV light, laser scanning, or wet stripping to expose top surface 247 of WLCSP 248.

Figure 5F:
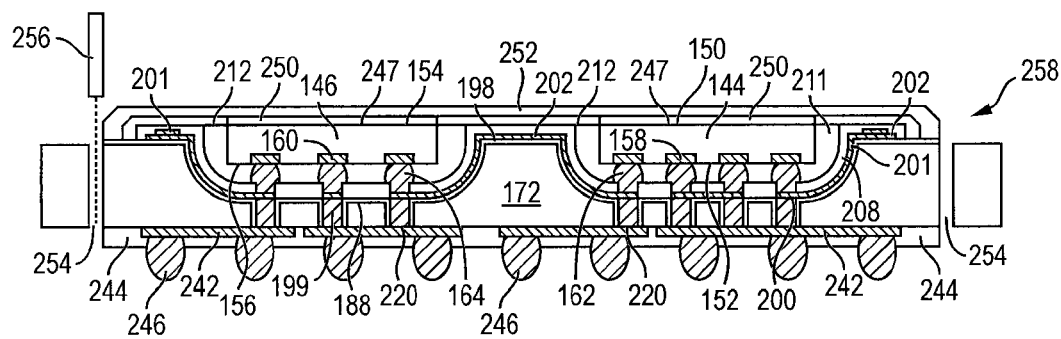

In FIG. 5*f*, TIM 250 such as thermal epoxy, thermal epoxy resin, or thermal conductive paste is formed on back surface 150 of semiconductor die 144, and on back surface 154 of semiconductor die 146 of WLCSP 248. Heat spreader 252 is mounted over semiconductor die 144 and 146, conductive layer 201, and insulation layer 208, and is connected to TIM 250 and to semiconductor wafer 170. Heat spreader 252 can be Cu, Al, or other material with high thermal conductivity. TIM 250 and heat spreader 252 form a thermally conductive path that aids with distribution and dissipation of heat generated by semiconductor die 144 and 146 and increases the thermal performance of WLCSP 248. Semiconductor wafer 170 is singulated through saw streets 254 with saw blade or laser cutting tool 256, to form individual WLCSP 258.

Figure 6:
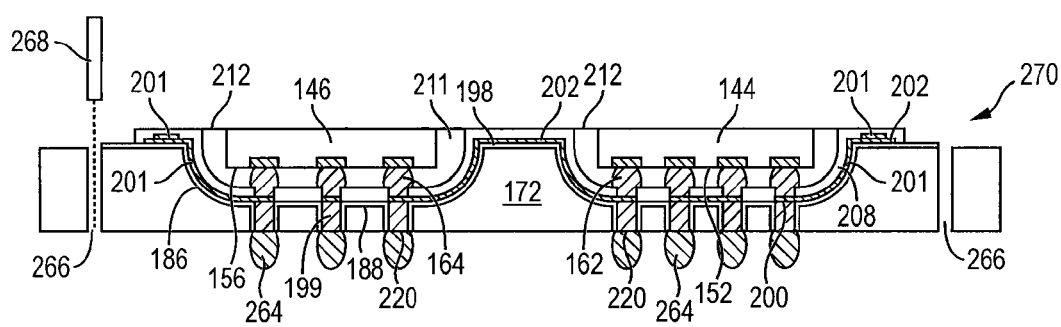
FIG. 6 illustrates a process of forming bumps over a surface of the semiconductor device substrate.

FIG. 6 shows another embodiment, continuing from FIG. 4*u*, with an electrically conductive bump material deposited over bottom surface 220 of TSVs 199 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bottom surface 220 of TSVs 199 using a suitable attachment or bonding process. In one embodiment, the bump material is reflowed by heating the material above its melting point to form spherical balls or bumps 264. In some applications, bumps 264 are reflowed a second time to improve electrical contact to bottom surface 220 of TSVs 199. Bumps 264 can be formed over a UBM having a wetting layer, barrier layer, and adhesive layer. The bumps can also be compression bonded to bottom surface 220 of TSVs 199. Bumps 264 represent one type of interconnect structure that can be formed over bottom surface 220 of TSVs 199. The interconnect structure can also use stud bump, micro bump, or other electrical interconnect.

With the formation of bumps 264, the WLCSP can be connected to external semiconductor devices, and electrical signals are then transmitted from bumps 264, through TSVs 199, conductive layer 201, and bumps 162 and 164 to semiconductor die 144 and 146, respectively. Additionally, electrical signals are transmitted from bumps 264, through TSVs 199 and conductive layer 201, to passive pattern 202.

FIG. 6 further shows that semiconductor wafer 170 is singulated through saw streets 266 with saw blade or laser cutting tool 268, to form individual WLCSP 270.

Figure 7A:
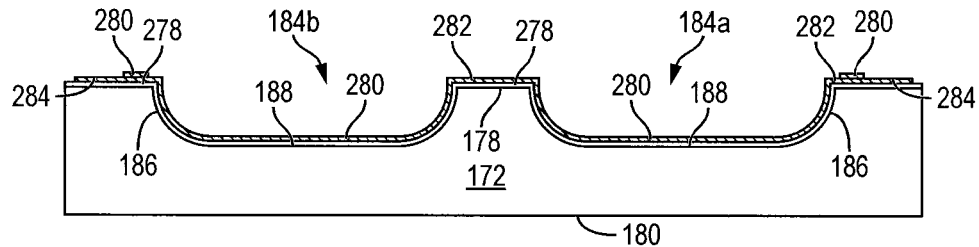
FIGS. 7a-7g illustrate another process of forming a semiconductor device including recesses formed in a substrate for different sized die electrically connected without conductive via.

FIGS. 7*a*-7*g* show another embodiment, continuing from FIG. 4*d*, with insulation or passivation layer 278 conformally applied over semiconductor wafer 170 using PVD, CVD, screen printing, spin coating, spray coating, sintering or thermal oxidation. In FIG. 7*a*, insulation layer 278 contains one or more layers of SiO2, Si3N4, SiON, Ta2O5, Al2O3, or other material having similar insulating and structural properties. Insulation layer 278 follows the contours of, and uniformly covers, bottom recess surface 188, curved side wall 186, and top surface 178.

An electrically conductive layer or RDL 280 is formed over insulation layer 278 using a patterning and metal deposition process such as printing, PVD, CVD, sputtering, electrolytic plating, and electroless plating. Conductive layer 280 can be one or more layers of Al, Cu, Sn, Ni, Au, Ag, or other suitable electrically conductive material. Conductive layer 280 is formed over, and follows the contours of, insulation layer 278, bottom recess surface 188, curved side wall 186, and top surface 178. The electrical path of conductive layer 280 follows the contours of curved side wall 186. The smooth contours of curved side wall 186 facilitate the formation of conductive layer 280 from over bottom recess surface 188 to over top surface 178. The geometry of curved side wall 186 provides good reliability for the portion of conductive layer 280 formed over the curved side wall. Portions of conductive layer 280 can be electrically common or electrically isolated depending on the design and function of the later mounted semiconductor die.

Conductive layer 280 also forms a passive pattern 282 over top surface 178 of semiconductor wafer 170. The formation of passive pattern 282 allows for the formation of embedded passive components, such as inductors, capacitors, and resistors, resulting in good electrical properties without the use of SMT. The formation of passive pattern 282 reduces the cost of passive component formation, and the need to provide an additional package substrate, thereby further reducing cost. Furthermore, the configuration of passive pattern 282 can be easily modified by changing only the mask and process used to form passive pattern 282.

Contact or bond pads 284 are formed over top surface 178 of semiconductor wafer 170. Contact pads 284 can formed as a portion of conductive layer 280. Contact pads 284 can also be formed separately from conductive layer 280 by PVD, CVD, electrolytic plating, or electroless plating process. Contact pads 284 are made with a conductive material, such as Al, Cu, Sn, Ni, Au, or Ag. Contact pads 284 are electrically connected to conductive layer 280.

Figure 7B:
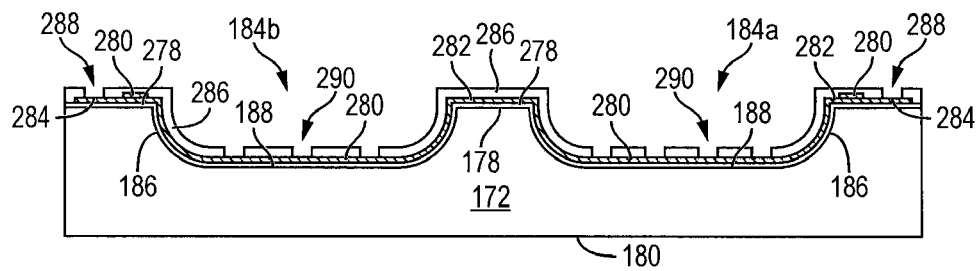

In FIG. 7b, an insulation or passivation layer 286 is conformally applied over semiconductor wafer 170, conductive layer 280, and contact pads 284 using PVD, CVD, screen printing, spin coating, spray coating, sintering or thermal oxidation. Insulating layer 286 contains one or more layers of SiO2, Si3N4, SiON, Ta2O5, Al2O3, or other material having similar insulating and structural properties. Insulating layer 286 follows the contours of, and uniformly covers, conductive layer 280, bottom recess surface 188, curved side wall 186, and top surface 178. Portions of insulating layer 286 are subsequently removed to form openings 288 in the insulating layer, thereby exposing contact pads 284. Portions of insulating layer 286 are also removed to form openings 290 in the insulating layer, thereby exposing portions of conductive layer 280.

Figure 7C:
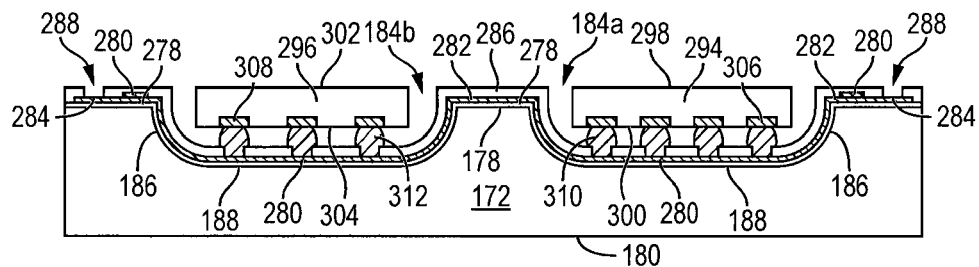

In FIG. 7c, semiconductor die 294 and 296 are mounted into recesses 184a and 184b, with active surface 300 and 304, respectively, oriented toward bottom recess surface 188 of semiconductor wafer 170. In one embodiment, semiconductor die 294 has a die area one to three times the die area of semiconductor die 296. However, semiconductor die 294 and 296 can be used regardless of the relative sizing between the semiconductor die. Recesses 184a and 184b are sized to accommodate the size of semiconductor die 294 and 296, respectively, including a gap between sidewall 186 and the semiconductor die. Back surfaces 298 and 302 of semiconductor die 294 and 296, respectively, can be positioned below a surface substantially coplanar with a portion of insulation layer 286 formed over top surface 178 of semiconductor wafer 170. That is, the entirety of semiconductor die 294 and 296 is within recesses 184a and 184b, respectively. Alternatively, back surfaces 298 and 302 of semiconductor die 294 and 296, respectively, are positioned over a surface substantially coplanar with a portion of insulation layer 286 formed over top surface 178 of semiconductor wafer 170. Thus, semiconductor die 294 and 296 are partially within recesses 184a and 184b, respectively. When semiconductor die 294, semiconductor die 296, and semiconductor wafer 170 are all made of silicon, differences in CTE are reduced.

Bumps 310 and 312 of semiconductor die 294 and 296, respectively, are metallurgically and electrically connected to contact pads 306 and 308 respectively. Bumps 310 and 312 are also metallurgically and electrically connected to conductive layer 280 through openings 290 in insulation layer 286. Therefore, semiconductor die 294 and 296 are also electrically connected to passive pattern 282, and contact pads 284.

Figure 7D:
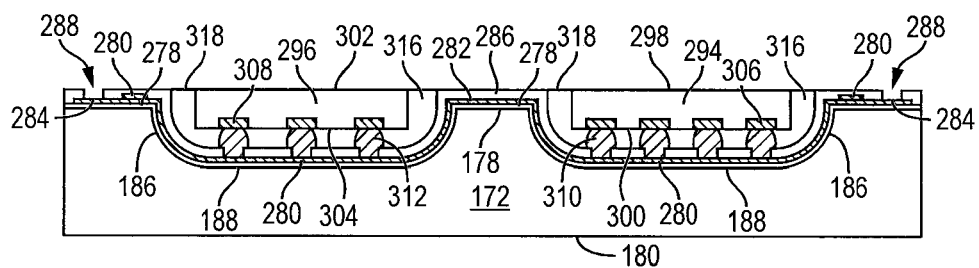

In FIG. 7d, an encapsulant or molding compound 316 is deposited into recesses 184a and 184b and around semiconductor die 294 and 296 using a paste printing, compressive molding, transfer molding, liquid encapsulant molding, vacuum lamination, spin coating, or other suitable applicator. Encapsulant 316 can be polymer composite material, such as epoxy resin with filler, epoxy acrylate with filler, or polymer with proper filler. Encapsulant 316 is non-conductive and environmentally protects semiconductor device 294 and 296 from external elements and contaminants. Surface 318 of encapsulant 316 is substantially coplanar with back surface 302 of semiconductor die 296 and back surface 298 of semiconductor 294. Alternatively, surface 318 of encapsulant 316 is substantially coplanar with the portion of insulation layer 286 formed over top surface 178 of semiconductor wafer 170.

Encapsulant 316 also fills a space between active surface 300 and insulation layer 286 around bumps 310 of semiconductor die 294. Similarly, encapsulant 316 fills a space between active surface 304 and insulation layer 286 around bumps 312 of semiconductor die 296. In some applications, an underfill material, rather than an encapsulant, can be deposited between active surface 300 and insulation layer 286 around bumps 310. The underfill material is also deposited between active surface 304 and insulation layer 286 around bumps 312.

Figure 7E:
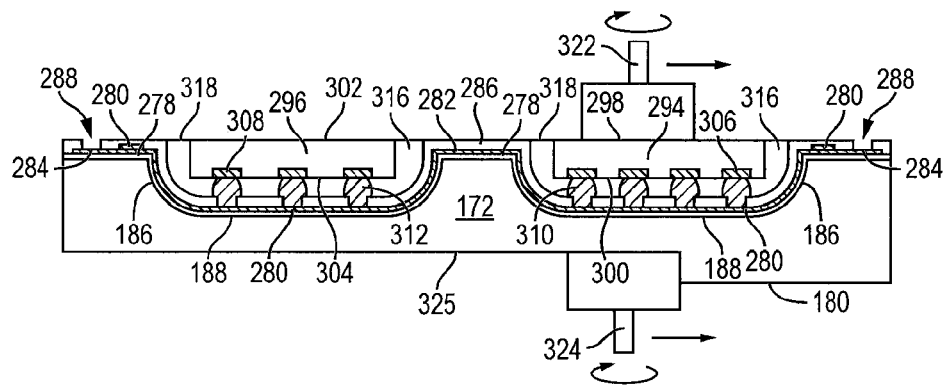

In FIG. 7e, surfaces 298, 302, and 318 undergo a grinding operation with grinder 322 to planarize back surface 298 of semiconductor die 294, back surface 302 of semiconductor die 296, and surface 318 of encapsulant 316. The planarization of surfaces 298, 302, and 318 removes material from the surface of the WLCSP and produces a uniformly flat surface, without exposing passive pattern 282, or conductive layer 280. The planarization process can also remove a portion of insulation layer 286. In FIG. 7e, bottom surface 180 of semiconductor wafer 170 also undergoes a grinding operation with grinder 324 to reduce the height of semiconductor wafer 170. The grinding operation also exposes a new bottom surface 325 of semiconductor wafer 170.

Figure 7F:
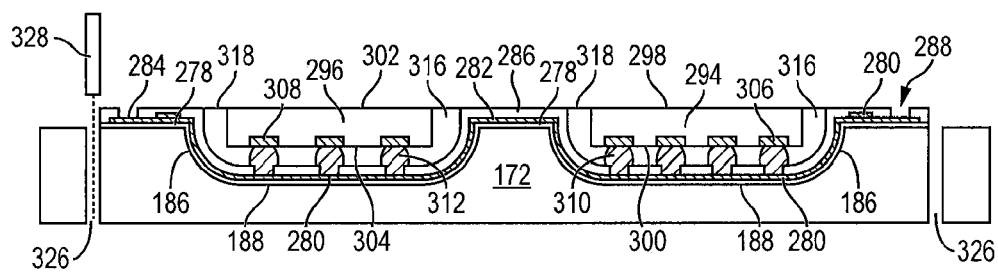

In FIG. 7f, semiconductor wafer 170 is singulated through saw streets 326 with saw blade or laser cutting tool 328 to form individual WLCSPs.

Figure 7G:
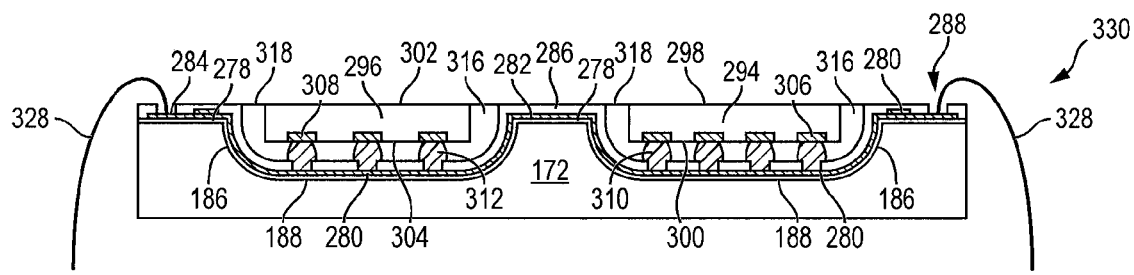

In FIG. 7g, bond wires 328 are formed between contact pads 284 and a semiconductor device external to WLCSP 330. Bond wires 328 are a low-cost, stable technology for forming electrical connections. Bond wires 328 electrically connect semiconductor die 294, semiconductor die 296, and passive pattern 282 to a semiconductor device external to WLCSP 330.

Figure 8:
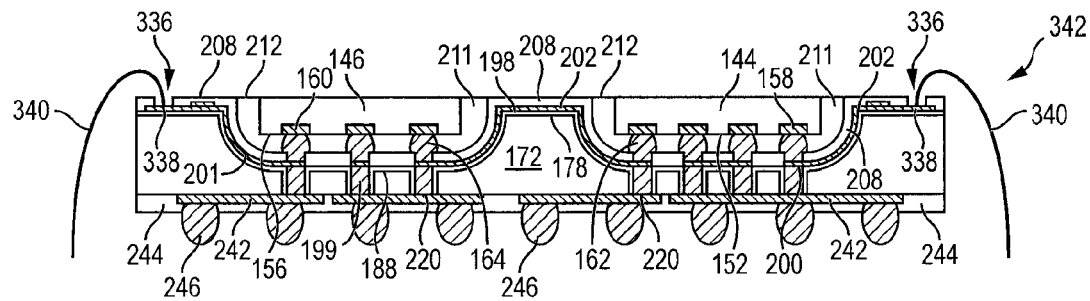
FIG. 8 illustrates a semiconductor device with wire bonds and an interconnect structure formed over a surface of the semiconductor device substrate.

FIG. 8, similar to FIG. 5e, shows an electrically conductive layer or RDL 201 formed over insulation layer 198 using a patterning and metal deposition process such as printing, PVD, CVD, sputtering, electrolytic plating, and electroless plating. Conductive layer 201 can be one or more layers of Al, Cu, Sn, Ni, Au, Ag, or other suitable electrically conductive material.

Contact or bond pads 338 are formed over top surface 178 of semiconductor wafer 170. Contact pads 338 are formed as a portion of conductive layer 201, or are formed separately from conductive layer 201 by PVD, CVD, electrolytic plating, or electroless plating process. Contact pads 338 are made with a conductive material, such as Al, Cu, Sn, Ni, Au, or Ag. Contact pads 338 are electrically connected to conductive layer 201. Portions of insulating layer 208 are removed to form openings 336 in the insulating layer, thereby exposing contact pads 338.

Bond wires 340 are formed between contact pads 338 and a semiconductor device external to WLCSP 342. Bond wires 340 are a low-cost, stable technology for forming electrical connections. Bond wires 340 electrically connect semiconductor die 144, semiconductor die 146, and passive pattern 202 to a semiconductor device external to WLCSP 342.

Figure 9:
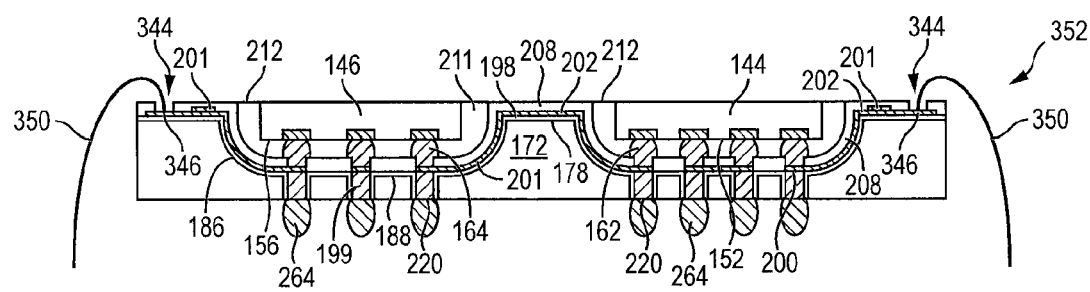
FIG. 9 illustrates a semiconductor device with wire bonds and bumps formed over a surface of the semiconductor device substrate.

FIG. 9, similar to FIG. 6, shows an electrically conductive layer or RDL 201 formed over insulation layer 198 using a patterning and metal deposition process such as printing, PVD, CVD, sputtering, electrolytic plating, and electroless plating. Conductive layer 201 can be one or more layers of Al, Cu, Sn, Ni, Au, Ag, or other suitable electrically conductive material.

Contact or bond pads 346 are formed over top surface 178 of semiconductor wafer 170. Contact pads 346 are formed as a portion of conductive layer 201, or are formed separately from conductive layer 201 by PVD, CVD, electrolytic plating, or electroless plating process. Contact pads 346 are made with a conductive material, such as Al, Cu, Sn, Ni, Au, or Ag. Contact pads 346 are electrically connected to conductive layer 201. Portions of insulating layer 208 are removed to form openings 344 in the insulating layer, thereby exposing contact pads 346.

Bond wires 350 are formed between contact pads 346 and a semiconductor device external to WLCSP 352. Bond wires 350 are a low-cost, stable technology for forming electrical connections. Bond wires 350 electrically connect semiconductor die 144, semiconductor die 146, and passive pattern 202 to a semiconductor device external to WLCSP 352.

Figure 10:
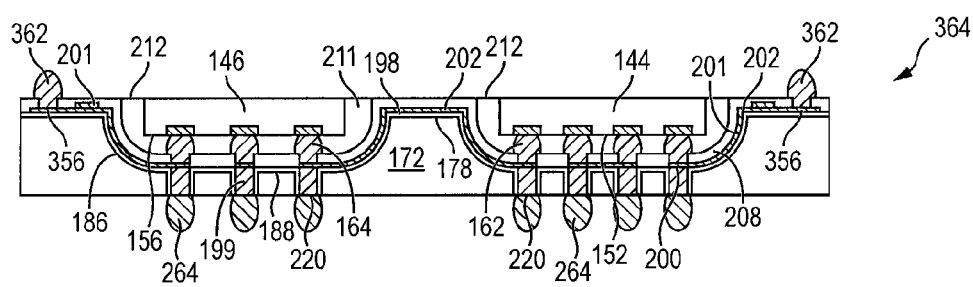
FIG. 10 illustrates a semiconductor device with bumps formed over a first and second surface of the semiconductor device.

FIG. 10, similar to FIG. 6, shows an electrically conductive layer or RDL 201 formed over insulation layer 198 using a patterning and metal deposition process such as printing, PVD, CVD, sputtering, electrolytic plating, and electroless plating. Conductive layer 201 can be one or more layers of Al, Cu, Sn, Ni, Au, Ag, or other suitable electrically conductive material.

Contact or bond pads 356 are formed over top surface 178 of semiconductor wafer 170. Contact pads 356 are formed as a portion of conductive layer 201, or are formed separately from conductive layer 201 by PVD, CVD, electrolytic plating, or electroless plating process. Contact pads 356 are made with a conductive material, such as Al, Cu, Sn, Ni, Au, or Ag. Contact pads 356 are electrically connected to conductive layer 201, and are exposed by the removal of a portion of insulating layer 208.

An electrically conductive bump material is deposited over contact pads 356 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 356 using a suitable attachment or bonding process. In one embodiment, the bump material is reflowed by heating the material above its melting point to form spherical balls or bumps 362. In some applications, bumps 362 are reflowed a second time to improve electrical contact to contact pads 356. Bumps 362 can be formed over a UBM having a wetting layer, barrier layer, and adhesive layer. The bumps can also be compression bonded to contact pads 356. Bumps 362 represent one type of interconnect structure that can be formed over contact pads 356. The interconnect structure can also use stud bump, micro bump, or other electrical interconnect. Bumps 362 electrically connect semiconductor die 144, semiconductor die 146, and passive pattern 202 to a semiconductor device external to WLCSP 364.

Figure 11:
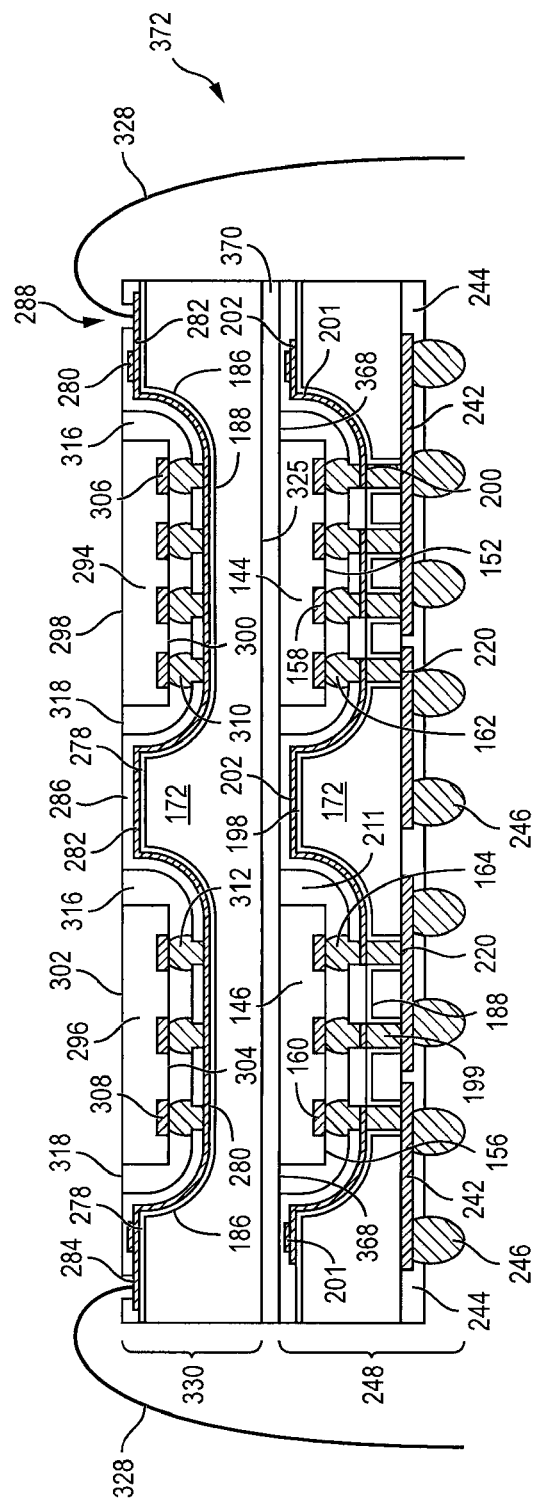
FIG. 11 illustrates a semiconductor device including the semiconductor device of FIG. 7g stacked over the semiconductor device of FIG. 5e.
Figure 12:
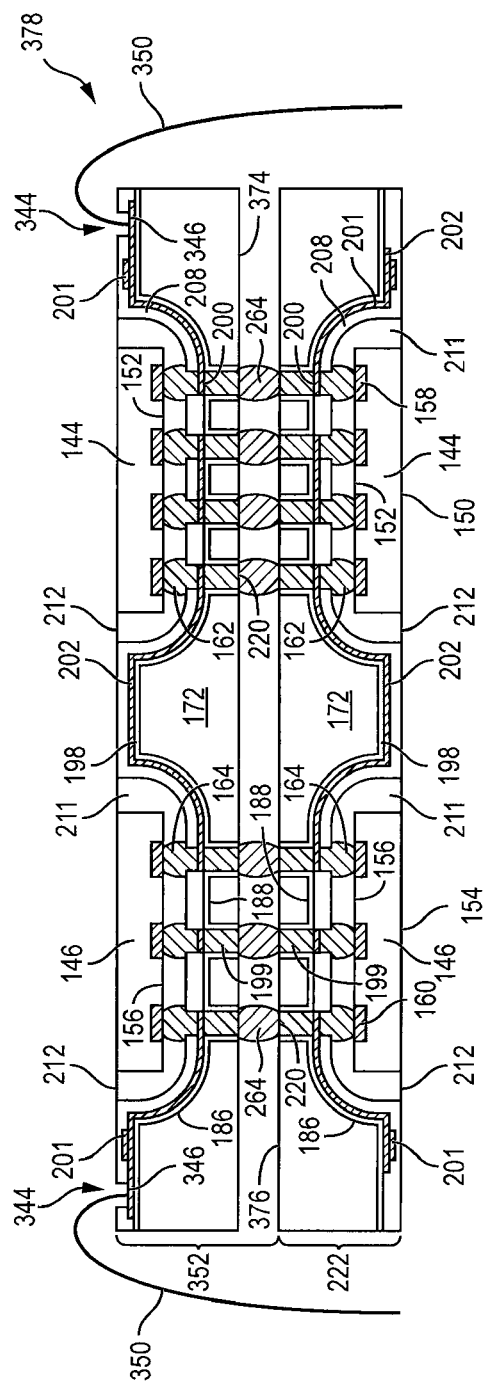
FIG. 12 illustrates a semiconductor device including the semiconductor device of FIG. 9 stacked over the semiconductor device of FIG. 4u.
Figure 13:
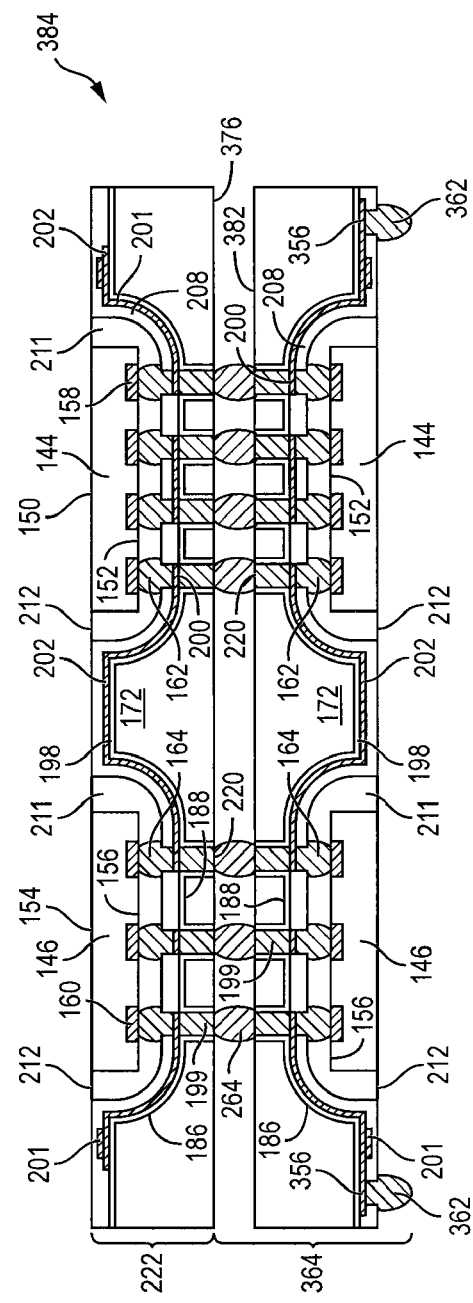
FIG. 13 illustrates a semiconductor device including the semiconductor device of FIG. 4u stacked over the semiconductor device of FIG. 10.

FIGS. 11-13, show various stacked WLCSPs that are connected using bond wires and flip chip type bonding according to the input output (I/O) count, interconnection method, and application of the semiconductor die. FIG. 11 shows WLCSP 330, from FIG. 7g, stacked over WLCSP 248, from FIG. 5e. Bottom surface 325 of WLCSP 330 is connected to top surface 368 of WLCSP 248 with adhesive 370. Adhesive 370 includes materials such as epoxy resin, or double sided tape. As a stacked WLCSP 372, semiconductor die 144, semiconductor die 146, and passive pattern 202 of WLCSP 248 electrically connect to a semiconductor device external to WLCSP 372 through bumps 246. Semiconductor die 294, 296, and passive pattern 282 of WLCSP 330 electrically connect to a semiconductor device external to WLCSP 372 through bond wires 328.

FIG. 12 shows WLCSP 352, from FIG. 9, mounted over WLCSP 222, from FIG. 4u. WLCSPs 352 and 222 are oriented such that bottom surface 374 of WLCSP 352 faces bottom surface 376 of WLCSP 222. Bumps 264 of WLCSP 352 are electrically connected to bottom surface 220 of TSVs 199 of WLCSP 222. Semiconductor die 144, semiconductor die 146, and passive pattern 202 of WLCSPs 352 and 222 are electrically connected to each other through bumps 264, and to a semiconductor device external to WLCSP 378 through bond wires 350.

FIG. 13 shows WLCSP 222, from FIG. 4u, stacked over WLCSP 364, from FIG. 10. WLCSPs 222 and 364 are oriented such that bottom surface 376 of WLCSP 222 faces toward bottom surface 382 of WLCSP 364. Bumps 264 of WLCSP 364 are electrically connected to bottom surface 220 of TSVs 199 of WLCSP 222. Semiconductor die 144, semiconductor die 146, and passive pattern 202 of WLCSPs 364 and 222 are electrically connected to each other through bumps 264, and to a semiconductor device external to WLCSP 384 through bumps 362.

While one or more embodiments of the WLCSP have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first recess in a surface of the substrate;
   forming a plurality of conductive vias in a surface of the first recess;
   forming a first conductive layer over the surface of the substrate over a curved side wall of the first recess and electrically connected to the plurality of conductive vias;
   disposing a first semiconductor die within the first recess electrically connected to the first conductive layer, the first semiconductor die including a first bump disposed within the recess and electrically connected to the first conductive layer; and
   forming an interconnect structure over the substrate and electrically connected to the plurality of conductive vias and first semiconductor die.

2. The method of claim 1, further including:
   forming a second recess, with a size different from a size of the first recess, in the surface of the substrate;

disposing a second semiconductor die over the second recess, the second semiconductor die including a size different from a size of the first semiconductor die, and the second semiconductor die being electrically connected to the first conductive layer; and depositing an encapsulant into the first and second recesses and around the first and second semiconductor die.

3. The method of claim 1, wherein forming the interconnect structure includes:

forming a second conductive layer over, and electrically connected to, the plurality of conductive vias;

forming an insulation layer over the second conductive layer; and forming a second bump over, and electrically connected to, the second conductive layer.

4. The method of claim 1, further including forming a passive pattern including a passive device over the surface of the substrate and electrically connected to the first conductive layer.

5. The method of claim 1, further including:

depositing a thermal interface material (TIM) on a surface of the first semiconductor die; and disposing a heat spreader over the semiconductor device and connected to the TIM to improve thermal performance of the semiconductor device.

6. The method of claim 1, further including providing fiducial or align marks on the substrate to aid with alignment when disposing the first semiconductor die over the first recess.

7. The method of claim 1, further including forming a bond wire electrically connected to the first semiconductor die.

8. A method of making a semiconductor device, comprising:

providing a substrate;

forming a first recess in a surface of the substrate;

forming a conductive layer over the surface of the substrate and over a curved side wall of the first recess;

disposing a first semiconductor die including a bump within the first recess and electrically connected to the conductive layer; and forming an interconnect structure electrically connected to the first semiconductor die.

9. The method of claim 8, further including:

forming a second recess, with a size different from a size of the first recess, in the surface of the substrate;

mounting a second semiconductor die into the second recess, the second semiconductor die including a size different from a size of the first semiconductor die, and the second semiconductor die being electrically connected to the conductive layer; and depositing an encapsulant into the first and second recesses and around the first and second semiconductor die.

10. The method of claim 8, wherein the interconnect structure includes forming bond wires.

11. The method of claim 8, further including forming a passive pattern including an inductor, capacitor, or resistor over the surface of the substrate and electrically connected to the conductive layer.

12. The method of claim 8, further including:

depositing a thermal interface material (TIM) on a surface of the first semiconductor die; and mounting a heat spreader over the semiconductor device and connected to the TIM to improve thermal performance of the semiconductor device.

13. The method of claim 8, further including providing fiducial or align marks on the substrate to aid with alignment when disposing the first semiconductor die over the first recess.

14. The method of claim 8, wherein the substrate and first semiconductor die are made of silicon, to reduce differences in coefficients of thermal expansion.

15. A semiconductor device, comprising:

a substrate;

a first recess formed partially through a surface of the substrate;

a conductive layer formed over the surface of the substrate and over curved side walls of the first recess;

a first semiconductor die disposed over the first recess and electrically connected to the conductive layer;

an interconnect structure electrically connected to the first semiconductor die; and a second recess formed in the surface of the substrate with the second recess including a size different from a size of the first recess.

16. The semiconductor device of claim 15, further including a plurality of conductive vias formed in the substrate and electrically connected to the first semiconductor die and the interconnect structure.

17. The semiconductor device of claim 15, further including:

a second semiconductor die disposed over the second recess, the second semiconductor die including a size different from a size of the first semiconductor die, and the second semiconductor die being electrically connected to the conductive layer; and an encapsulant deposited in the first and second recesses and around the first and second semiconductor die.

18. The semiconductor device of claim 15, further including a passive pattern including an inductor, capacitor, or resistor formed over the surface of the substrate and electrically connected to the conductive layer.

19. The semiconductor device of claim 15, further including:

a thermal interface material (TIM) deposited on a surface of the first semiconductor die; and a heat spreader disposed over the semiconductor device and connected to the TIM to improve thermal performance of the semiconductor device.

20. A semiconductor device comprising:

a substrate;

a first recess formed in a surface of the substrate;

a conductive layer formed over the surface of the substrate and over a curved side wall of the first recess;

a first semiconductor die including a bump, the first semiconductor die and bump disposed within the first recess and electrically connected to the conductive layer; and an interconnect structure formed over the substrate and electrically connected to the first semiconductor die.

21. The semiconductor device of claim 20, further including:

a second recess formed in the surface of the substrate; and a second semiconductor die disposed over the second recess with the second semiconductor die including a size different from a size of the first semiconductor die and being electrically connected to the conductive layer.

22. The semiconductor device of claim 20, further including a heat spreader disposed over the semiconductor device.

23. The semiconductor device of claim 21, wherein the second recess includes a size different from a size of the first recess.

24. A semiconductor device, comprising:
a substrate;
a first recess formed in a surface of the substrate;
a conductive layer formed over the surface of the substrate and over a curved side wall of the first recess;
a first semiconductor die disposed over the first recess and electrically connected to the conductive layer; and
a heat spreader disposed over the first semiconductor die.

25. A semiconductor device comprising:
a substrate;
a first recess formed through a surface of the substrate with the first recess including a curved side wall;
a conductive layer formed over the surface of the substrate and over the curved side wall of the first recess;
a first semiconductor die disposed within the first recess and electrically connected to the conductive layer; and
a second recess formed in the surface of the substrate with the second recess including a size different from a size of the first recess.

26. The semiconductor device of claim 25, further including a second semiconductor die disposed over the second recess with the second semiconductor die including a size different from a size of the first semiconductor die and being electrically connected to the conductive layer.

27. The semiconductor device of claim 25, further including an interconnect structure formed over the substrate and electrically connected to the first semiconductor die.

28. The semiconductor device of claim 25, further including a conductive via formed in the substrate and electrically connected to the first semiconductor die.

29. The semiconductor device of claim 25, further including a heat spreader disposed over the semiconductor device.

\* \* \* \* \*